US006934050B2

(12) United States Patent
Merrill et al.

(10) Patent No.: US 6,934,050 B2
(45) Date of Patent: Aug. 23, 2005

(54) METHOD FOR STORING AND RETRIEVING DATA FROM AN IMAGING ARRAY OF VERTICAL-COLOR-FILTER DETECTOR GROUPS

(75) Inventors: Richard B. Merrill, Woodside, CA (US); Richard F. Lyon, Los Altos, CA (US); Carver A. Mead, Santa Clara, CA (US)

(73) Assignee: Foveon, Inc., Santa Clara, CA (US)

( * ) Notice: Subject to any disclaimer, the term of this patent is extended or adjusted under 35 U.S.C. 154(b) by 626 days.

(21) Appl. No.: 10/091,361

(22) Filed: Mar. 4, 2002

(65) Prior Publication Data

US 2002/0171881 A1 Nov. 21, 2002

Related U.S. Application Data

(63) Continuation of application No. 09/884,863, filed on Jun. 18, 2001, now Pat. No. 6,727,521, which is a continuation of application No. 09/316,731, filed on May 21, 1999, now Pat. No. 6,731,397.

(51) Int. Cl.[7] .......................... G06K 1/00; H01L 31/00; H01L 27/00; G01S 3/50
(52) U.S. Cl. .................. 358/1.16; 257/98; 257/440; 250/226; 250/208.1
(58) Field of Search .................. 358/1.16; 257/98, 257/440; 250/226, 208.1

(56) References Cited

U.S. PATENT DOCUMENTS

| 4,677,289 | A | | 6/1987 | Nozaki et al. ............... 250/226 |
|---|---|---|---|---|
| 4,845,553 | A | | 7/1989 | Konomura et al. ........... 358/98 |
| 5,414,465 | A | | 5/1995 | Kodama et al. ............ 348/236 |
| 5,557,688 | A | * | 9/1996 | Nakamura .................. 382/164 |
| 5,965,875 | A | * | 10/1999 | Merrill ....................... 250/226 |
| 6,281,561 | B1 | * | 8/2001 | Stiebig et al. .............. 257/440 |

FOREIGN PATENT DOCUMENTS

| JP | 06 133 320 | 5/1994 | ............ H04N/9/09 |
|---|---|---|---|
| JP | 08 009 391 | 1/1996 | ............ H04N/9/04 |

* cited by examiner

Primary Examiner—Edward Coles
Assistant Examiner—Houshang Safaipour
(74) Attorney, Agent, or Firm—Sierra Patent Group, Ltd.

(57) ABSTRACT

A method for storing a full Red, Green, Blue (RGB) data set. A full RGB data set is three-color image data captured with an imager array formed on a semiconductor substrate and comprising a plurality of vertical-color-filter detector groups. Each of the vertical color detector groups comprises three detector layers each configured to collect photo-generated carriers of a first polarity, separated by intervening reference layers configured to collect and conduct away photo-generated carriers of opposite polarity, the three detector layers being disposed substantially in vertical alignment with respect to one another and having different spectral sensitivities. The three-color image data is then stored as digital data in a digital storage device without performing interpolation on the three-color image data.

36 Claims, 21 Drawing Sheets typical examples:
M= 640x480x3=921,600
M= 1600x1250x3=6 meg
M= 3000x2000x3=18 meg

METHOD FOR STORING AND RETRIEVING DATA FROM AN IMAGING ARRAY OF VERTICAL-COLOR-FILTER DETECTOR GROUPS

PRIORITY

This application is a continuation of and claims benefit of U.S. patent application Ser. No. 09/884,863 filed on Jun. 18, 2001, now U.S. Pat. No. 6,727,521, which is a continuation of Ser. No. 09/316,731 filed on May 21, 1999, now U.S. Pat. No. 6,731,397.

BACKGROUND OF THE INVENTION

1. Field of the Invention

The present invention relates to the capture, storage, and retrieval of digital images. More particularly, the present invention relates to novel methods for storing and retrieving pixel data from a full-color RGB imaging array imbedded in a device such as a digital camera.

Furthermore, the present invention also relates to vertical-color-filter detector groups and arrays thereof. More particularly, the present invention relates to arrays of detector groups wherein each of the detector groups is a multilayer junction structure to ensure that each pixel sensor in the array measures each of the three primary colors (R-G-B) in the same location.

Finally, the present invention relates to a device such as a digital camera that employs both an array of vertical-color-filter detector groups and a novel method of capturing, storing, and retrieving the data provided by the array.

2. The Prior Art

MOS active pixel sensors and multiple-wavelength sensors are known in the art. One type of multiple-wavelength sensor employs red, green, and blue sensors disposed horizontally in a pattern at or near the semiconductor surface. Color overlay filters are employed to produce the color selectivity between the red, green, and blue sensors. Such sensors have the disadvantage of occupying a relatively large area per pixel as these sensors are tiled together in a plane.

Another type of multiple-wavelength sensor employs more than one sensor in a vertically-oriented group. An example of an early multiple-wavelength vertical-color-filter sensor group for detecting visible and infrared radiation is disclosed in U.S. Pat. No. 4,238,760 issued to Carr, in which a first diode in a surface n-type epitaxial region is responsive to visible light and a second buried region in an underlying n-type substrate is responsive to infrared radiation. Contact to the buried photodiode is made using deep diffusion processes similar to diffusion-under-film collector contact common in bipolar IC processing and for $R_{CS}$ reduction. The disclosed device has a size of 4 mils square. An alternative embodiment employs V-groove MOS transistors to contact the buried p-type region of the infrared diode.

The device disclosed in the Carr patent has several shortcomings, the most notable being its large area, rendering it unsuitable for the image sensor density requirements of modern imaging systems. The technology employed for contact formation to the buried infrared sensing diode is also not suitable for modem imaging technology or extension to a three-color sensor.

A particular example of a three-color visible-light prior art vertical-pixel-sensor group is disclosed in U.S. Pat. No. 5,965,875 to Merrill. In Merrill, a structure is provided using a triple-well CMOS process wherein blue, green and red sensitive PN junctions are disposed at different depths beneath the surface of the semiconductor substrate upon which the imager is fabricated.

There is also the problem of processing, storing and retrieving digital data captured by a three-color vertical sensor group.

Generally, a digital image is provided from a source such as a camera. Many types of cameras are prevalent in the field of digital imaging, including digital photograph, video, and television cameras. Whatever type of camera is used, it is often desired that the image be captured and stored in a digital format, so that the image may later be edited or otherwise processed. In the prior art, it is common to interpolate and compress the digital image data prior to storage. Manipulating the data before storing it poses certain disadvantages that are inherent in the procedures utilized heretofore in the prior art.

First, the process of interpolation may introduce irreversible changes in the digital image data. Interpolation is the process of correcting the data for errors that occur by virtue of the type of camera or sensor utilized within the camera. Therefore, the type of interpolation that is used, or the need for interpolation at all, is determined by the nature of the imaging process being utilized. For example, some digital sensors contain Charge-Coupled Devices (CCD) or metal-oxide-semiconductor (MOS) transistors. The smallest resolvable full-color image component usually comprises for separate sensors: two green, one blue, and one red. These sensors are used to produce three-color digital output. However, interpolation is necessary to correct for distortions caused by small, though finite distances that separate the four individual sensors that make up each resolution element. The result of interpolation is often a substantial increase in the size of the original digital image. Most often the increase in size is three-fold. Along with an increase in size, interpolation can compromise the integrity of the original data if performed prior to storage.

Second, after the step of interpolation, the digital image data is often compressed prior to storage. Compression is necessary often because of the increase in size caused by interpolation. The compression must be performed to facilitate transmission through systems having limited bandwidth such as television systems. A problem with commonly used compression systems is that the original state of the image cannot be restored from the compressed data. This is a serious problem if use of the original image data is ever desired.

The problems with interpolation and compression prior to storage manifest as poor-quality output when the digital image is viewed on a screen or printed. In fact, interpolation and/or compression techniques often create moiré patterns on fine-pitched fabrics or result in loss of detail and/or distortions along the edges or between fine lines in the subject matter.

In the light of the above background, those skilled in the art desire an image storage and retrieval method that does not require interpolation and/or compression of a digital image data set.

BRIEF DESCRIPTION OF THE INVENTION

According to one aspect of the present invention, a vertical-color-filter detector group and an imaging array of such groups is provided. The term "vertical color filter" is meant to convey that color filtering is implemented by propagation of light vertically through the semi-conductor material of the sensor group and array, while "detector group" is meant to imply that several values, typically three color channels, are sensed at the same picture element location of each group in the array. The detector group with three sets of active-pixel-sensor readout circuitry occupies one pixel location in the array, and is sometimes referred to herein as a pixel sensor, a vertical-color-filter pixel sensor, or a color pixel sensor.

This invention further provides a storage and a retrieval process that receives full-color RGB data from an imaging array and stores the data without the use of interpolation and/or lossy compression. The combination of a vertical-color-filter sensor group and an imaging array according to the invention provide data representative of an image without distortions typical of prior-art imaging array technologies. The present invention takes advantage of the lack of distortion in a full-color RGB data set from such an array to provide storage and retrieval processes without the use of interpolation and/or compression, to preserve the integrity of the original digital image data.

One vertical-color-filter detector group that is particularly useful in the present invention is formed on a semiconductor substrate. The sensor group comprises a plurality of detector layers configured by doping and/or biasing to collect photo-generated carriers of a first polarity, preferably negative electrons, separated by additional intervening layers configured to conduct away photo-generated carriers of the opposite polarity, preferably positive holes. The detection layers have different spectral sensitivities based upon different depths in the semiconductor substrate, doping levels, and biasing conditions. The detector layers are individually connected to active pixel sensor readout circuits. In one example of such a detector group, each detector group includes a blue photodetector n-type layer at the surface of the semiconductor, a green photodetector n-type layer deeper in the semiconductor, and a red photodetector n-type layer deepest in the semiconductor.

According to one example, a vertical three-color pixel group is formed on a semiconductor substrate and comprises at least six layers of alternating p-type and n-type doped regions. One of the regions may be the substrate. PN junctions between the layers operate as photodiodes with spectral sensitivities that depend on the absorption depth versus the wavelength of light in the semiconductor. Alternate layers, preferably the n-type layers, are detector layers to collect photo-generated carriers. The intervening layers, preferably the p-type layers, are reference layers and are connected in common to a reference potential referred to as ground.

Other vertical-color-filter detector groups, such as the one disclosed in U.S. Pat. No. 5,965,875 to Merrill may be employed in the present invention.

BRIEF DESCRIPTION OF THE DRAWINGS

The above and other features and advantages of this invention are described in the Detailed Description given below and the following drawings.

DETAILED DESCRIPTION OF THE INVENTION

Figure 1:
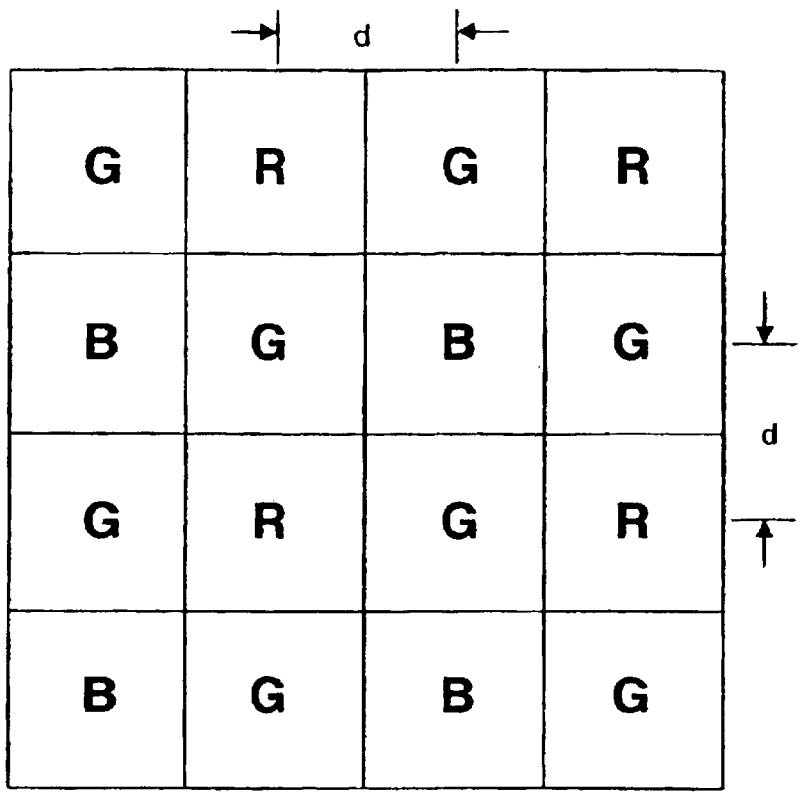
FIG. 1 illustrating the well-known Bayer color filter array (CFA) pattern.

Persons of ordinary skill in the art will realize that the following description of the present invention is only illustrative and not in any way limiting. Other embodiments of this invention will be readily apparent to those skilled in the art having benefit of this disclosure.

One full Red Green Blue (RGB) imager suitable for use in this invention is described in co-pending application Ser. No. 09/884,863 filed on Jun. 18, 2001. This co-pending application describes an active pixel-imaging array of vertical-color-filter groups. The advantage of a vertical-color-filter detector group is that each pixel location in the array measures each primary color at the same location, thus minimizing or eliminating the need for interpolation.

A further advantage of a full RGB imager is that all of the red, green, and blue image information is captured for a single pixel location is contained within a smaller space than in the pixel cluster of prior art imaging systems. This smaller space for capture allows finer resolution of the image. In a typical system in accordance with this invention, the full RGB imager may consist of, for example, an array of 640 by 480 three layer RGB full color pixel sensor that delivers a total of M=921,600 individual bytes of pixel data in the image data set. An illustrative non-limiting example of a denser imager that may be used in accordance with this invention is an imager array that includes an array of 3,000 by 2,000 pixel sensors (×3 R, G, B,) for a total of M=18,000,000 bytes of pixel data in the image data set. An alternative implementation of a full RGB imager is an assembly of three simple sensor arrays on a three-color separation prism with the three arrays optically aligned to each other as is known in the art of video cameras.

The full RGB imagers that are useful in this invention are directed toward color separation in the active pixel MOS imaging array that take advantage of the differences in absorption length in silicon of light of different wavelengths to measure different colors in the same location with a sensitive area almost as large as their spacing.

One color photosensor structure useful for incorporation into the invention separates blue, green and red light and is formed in a P-type silicon body. The color photosensor structure comprises a vertical PNPN device that implements a triple stacked photodiode and includes a first N-doped region formed in the P-type silicon body, a P-doped region formed in the first N-doped region, and a second N-doped region formed in the P-doped region. A triple-well process is employed according to the present invention to fabricate the color photosensor structure. The normal N well of the triple-well CMOS process is not employed in the color photosensor structure of the present invention, although it may be useful to use it on the same chip, outside of the array of imager cells.

In the color photosensor structure, the PN-junction formed between the P-type silicon body and the first N-doped region defines a red-sensitive photodiode at a depth in the silicon approximately equal to the absorption length of red light in silicon, the PN junction formed between the first N-doped region and the P-doped region defines a green-sensitive photodiode at a depth in the silicon approximately equal to the absorption length of green light in silicon, and the PN junction formed between the P-doped region and the second N-doped region defines a blue-sensitive photodiode at a depth in the silicon approximately equal to the absorption length of blue light. Sensing circuitry is connected to the red, green and blue photodiodes to integrate and store respective photodiode currents.

The full RGB imager reduces color-aliasing artifacts by ensuring that all pixel locations in an imaging array measure red, green, and blue color response in the same place of the array structure. Color filtration takes place by making use of the difference in absorption length in silicon of red, green, and blue light.

The full RGB imager provides advantages in addition to color aliasing. For example, the RGB imager eliminates the complex polymer-color-filter array process steps common in the prior art. Instead, a triple-well process is used. The full RGB imager also increases the overall efficiency in the use of the available photons. With the traditional approach, photons not being passed by the filter material are absorbed in the filter and wasted. With the approach of this invention, the photons are separated by absorption depth, but all are collected and used. This can result in overall improvement in quantum efficiency by a factor of three.

The full RGB imager of this invention provides an example of an imager that would be difficult to implement with conventional CCD technology. In addition, the present invention benefits from the availability of scaled CMOS processing in the sense that there are many support transistors in each three-color pixel.

Semiconductor devices for measuring the color of light are known in the non-imaging art. These devices have been built with a variety of technologies that depend upon the variation of photon absorption depth and wavelength. Examples are disclosed in U.S. Pat. No. 4,011,016 entitled "Semiconductor Radiation Wavelength Detector" and U.S. Pat. No. 4,309,604 entitled "Apparatus for Sensing the Wavelength and Intensity of Light." Neither patent discloses either a structure for a three-color integrated-circuit color sensor or an imaging array.

In the imaging art, CCD devices with multiple buried channels for accumulating and shifting photo charges are known. These devices are difficult and expensive to manufacture and have not been practical for three-color applications. U.S. Pat. No. 4,613,895 entitled "Color Responsive Imaging Device Employing Dependent Semiconductor Optical Absorption" discloses an example of such a device. This category also includes devices that use layers of thin film photosensitive materials applied on top of an imager integrated circuit. Examples of this technology are disclosed in U.S. Pat. No. 4,677,289 entitled "Color Sensor" and U.S. Pat. No. 4,651,001 titled "Visible/Infrared Imaging Device with Stacked Cell Structure." These structures are also difficult and expensive to produce and have not become practical.

Also known in the imaging art are color imaging integrated circuits that use a color filter mosaic to select different wavelength bands at different photo sensor locations. U.S. Pat. No. 3,971,065, entitled "Color Imaging Array", discloses an example of this technology. As discussed in Parluski et al., "Enabling Technologies for a Family of Digital Camera", 156/SPIE Vol. 2654, 1996 one pixel mosaic pattern commonly utilized in Digital cameras is the Bayer Color Filter Array (CFA) pattern.

Figure 2:
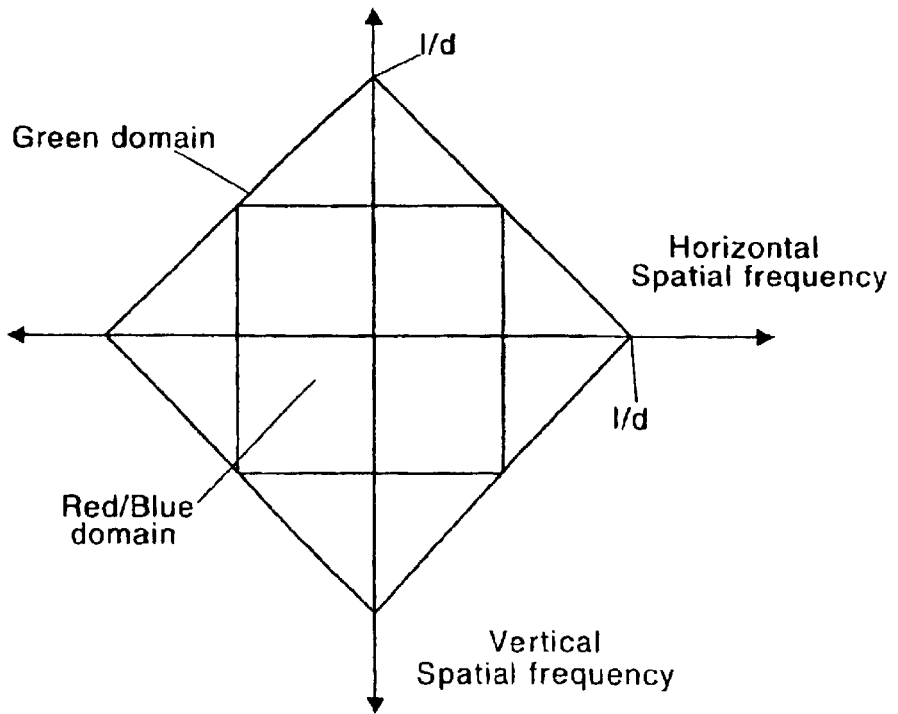
FIG. 2 illustrating the Nyquist domains for red, green and blue resulting from the Bayer CFA of FIG. 1.

Shown in FIG. 1, the Bayer CFA has 50% green pixels arranged in a checkerboard. Alternating lines of red and blue pixels are used to fill in the remainder of the pattern. As shown in FIG. 2, the Bayer CFA pattern results in a diamond shaped Nyquist domain for green and smaller, rectangular shaped Nyquist domains for red and blue. The human eye is more sensitive to high spatial frequencies in luminance than in chrominance and luminance is composed primarily of green light. Therefore, since the Bayer CFA provides the same Nyquist frequency for the horizontal and vertical spatial frequencies as a monochrome imager, the Bayer CFA improves the perceived sharpness of the digital image.

Mosaic approaches are well known in the art to be associated with aliasing problems due to the sensors being small compared to the spacing between sensors so that the sensors locally sample the image signal, and that the sensors for different colors are in different locations, so that the samples may not align between colors.

As pointed out above in the discussion of CCD color imaging arrays, the semiconductor processes employed in manufacturing arrays can be both difficult and expensive to implement. There are, however, CMOS technologies that are known that may be implemented with less expense and greater ease.

Figure 3:
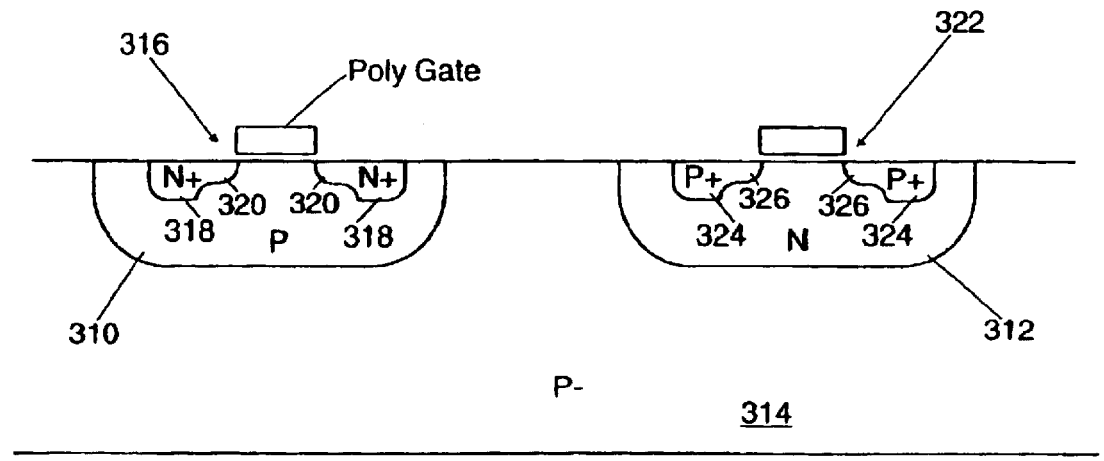
FIG. 3 illustrating a partial cross section drawing showing a conventional twin-well CMOS structure.

Referring to FIG. 3, many modern CMOS integrated circuit fabrication processes use a "twin-well" or "twin-tub" structure in which a P well region 310 and a N well region 312 of doping density of approximately $10^{17}$ atoms/cm$^3$ are used in regions within which to make N-channel and P-channel transistors respectively. The substrate material 314 is typically a lightly-doped P-type silicon ($10^{15}$ atoms/$cm^3$), so P well 310 is not isolated from substrate 314. The N-channel FET 316 formed in P-well 310 includes N+ normal source/drain diffusions 318 at a dopant concentration of >$10^{18}$ atoms/$cm^3$ and N-type shallow Lightly-Doped-Diffusion (LDD) regions 320 at a concentration of approximately $10^{18}$ atoms/$cm^3$. The P-channel FET 322 formed in N well region 312 is similarly constructed using normal P+ source/drain regions 324 and shallow LDD regions 326 of similar dopant concentrations.

Figure 4:
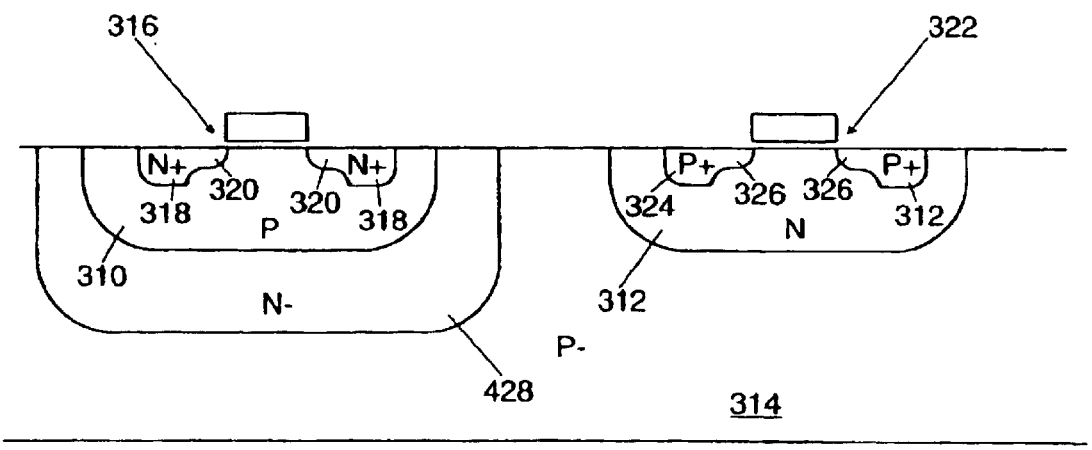
FIG. 4 illustrating a partial cross section drawing showing a conventional triple-well CMOS structure.

Referring to FIG. 4, in an improved process, known as "triple-well", an additional deep N isolation well 428 is used to provide well isolation of the P well 310 from substrate 314 and P well 310 ($10^{15}$ atom/$cm^3$ and $10^{17}$ atoms/$cm^3$ respectively). U.S. Pat. No. 5,397,734 titled "Method of Fabricating a Semiconductor Device Having a Triple-well Structure", discloses an example of triple-well technology.

Triple-well processes are becoming popular and economical for manufacturing MOS memory (DRAM) devices, since triple-well processes provide effective isolation of dynamic charge storage nodes from stray minority carriers that may be diffusing through the substrate.

Storage pixel sensors are also known in the art. In a storage pixel sensor, data representing intensity of light received by a photo transducer are stored in as storage element that can be read out and cleared using appropriate control circuitry.

Figure 5:
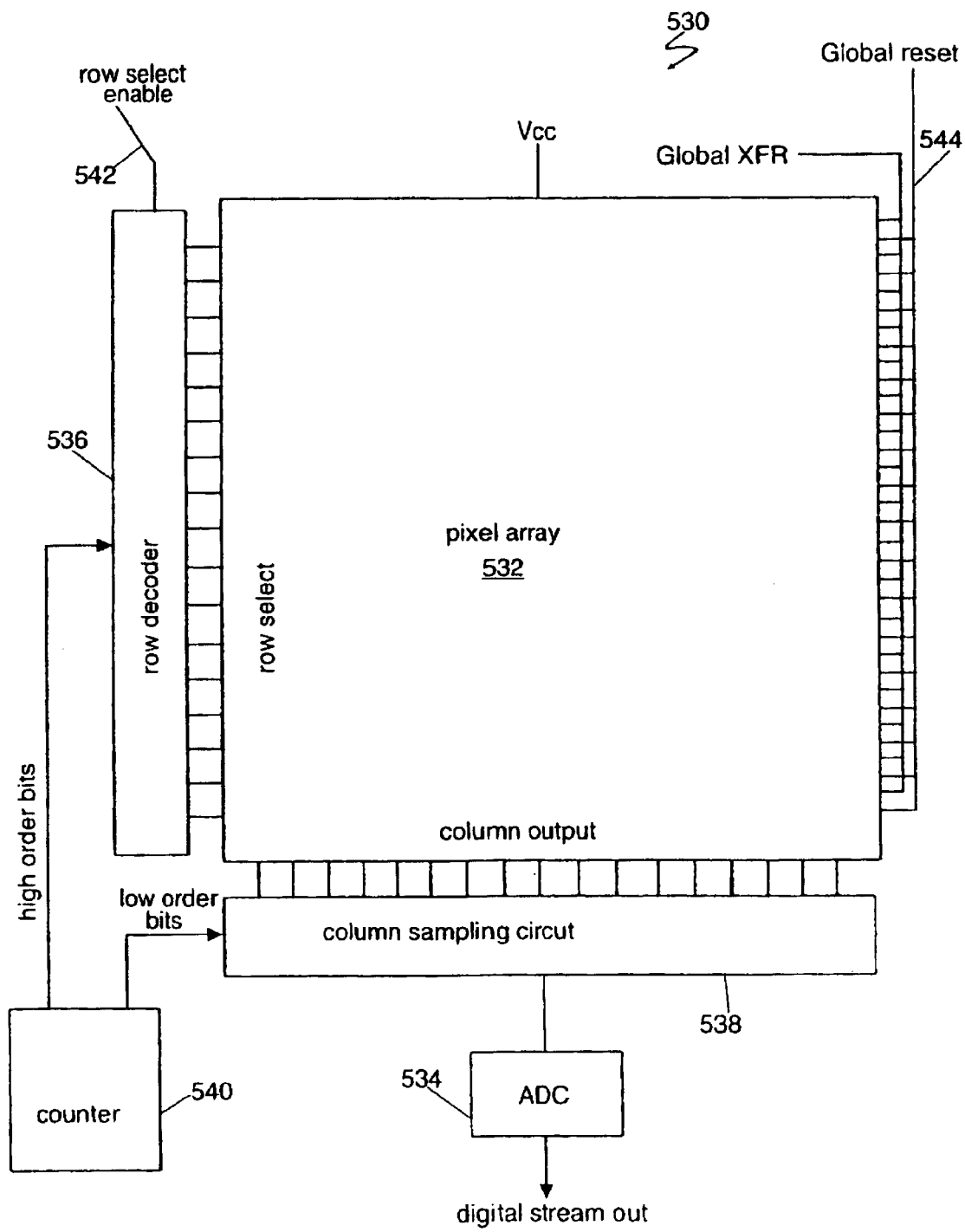
FIG. 5 illustrating a block diagram of an illustrative imager suitable for use with vertical-color-filter-pixel sensors in accordance with this invention.

FIG. 5 is a block diagram of one active pixel imager 530 suitable for use in accordance with this invention. In the imager 530, the active pixel sensors are arranged in rows and columns in pixel array sensor 532 to exact the analog pixel information from the pixel sensor array 532 for processing by Analog-to-Digital Converter (ADC) 534. Row-decoder circuit 536, column-sampling circuit 538 and counter 540 are also employed. Row-decoder circuit 536 selects rows from pixel-sensor array 532 in response to a row-enable signal 542 and signals from counter 540. The column sampling circuit 538 is also driven from the counter 540 and further includes a multiplexor that couples the sampled columns as desired to ADC 534 in response to signals from counter 540.

In a typical implementation, the higher-order bits from counter 540 are used to drive row-decoder circuit 536 and the lower-order bits are used to drive column-sampling circuit 538 to permit the extraction of all pixel information from a row in pixel-sensor array 532, prior to selection of the next row by row-decoder circuit 536. Row decoders, column-sampling circuits with embedded multiplexors, and counters suitable for use in imager 530 are well known to those of ordinary skill in the art and will not be described herein to avoid overcomplicating the disclosure and thereby obscuring this invention.

Figure 6:
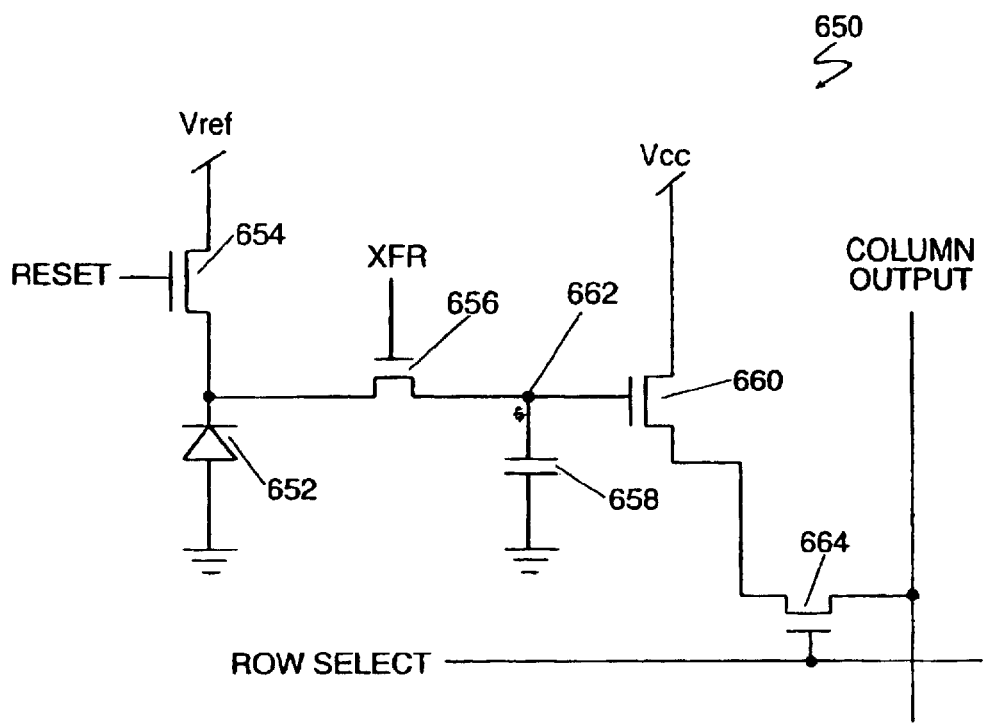
FIG. 6 illustrating a schematic diagram of an N-channel MOS implementation of a known active pixel sensor having a single storage node.

Referring to FIG. 6, a schematic diagram of a known active pixel sensor 650 with a single embedded storage element is shown. The active pixel sensor 650 is implemented with N-channel MOS transistors. Those of ordinary skill in the art will appreciate that the active pixel sensor 650 may be implemented with all P-channel MOS transistors or a combination of N-channel and P-channel transistors. In active pixel sensor 650, photodiode 652 has an anode connected to ground and a cathode connected to the source of N-channel MOS reset transistor 654. The drain of N-channel MOS reset transistor 654 is connected to $V_{ref}$ and the gate of N-channel MOS reset transistor 654 is connected to the global reset line indicated by reference numeral 544 in FIG. 5. The RESET line is preferably driven to a voltage at least a threshold above $V_{ref}$ to set the cathode of photodiode 652 to $V_{ref}$.

The cathode of photodiode 652 is also connected to a first source/drain of N-channel MOS transfer transistor 656. A second source/drain of N-channel MOS transfer transistor 656 is connected to a first terminal of storage element 658 and also a gate of N-channel MOS readout transistor 660. A second terminal of storage element 658 is connected to a reference potential shown as ground. The gate of N-channel MOS transfer transistor 656 is connected to global XFR line 1146 in FIG. 5. The connection of the second source/drain of N-channel MOS transfer transistor 656 to the first terminal of storage element 658 and also N-channel MOS transistor 660 forms a storage node 662. The drain of N-channel MOS readout transistor 660 is connected to $V_{cc}$. The source of N-channel MOS readout transistor 660 is connected to the drain of N-channel MOS row-select transistor 664. The gate of N-channel MOS row-select transistor 664 is connected to a column output line.

It should be appreciated that associated with storage node 662 is the N-channel MOS transfer transistor 656 to isolate storage node 662 from further collection of photo charge by the cathode of photodiode 652 when an integration period to be described below has ended, N-channel MOS readout transistor 660 to sense the charge accumulated on at storage node 662, and the storage element 658 to store the charge. Further, as disclosed in U.S. Pat. No. 6,097,022 entitled "Active Pixel Sensor with Bootstrap Amplification", by inventors Richard. B. Merrill and Richard F. Lyon, filed on Jun. 17, 1998, issued Aug. 1, 2000, assigned to the same assignee of this invention, and expressly incorporated herein by reference, the storage element 658 may be omitted and charge stored on the gate of N-channel MOS readout transistor 560 or other capacitive means of charge storage may be employed.

Figure 7:
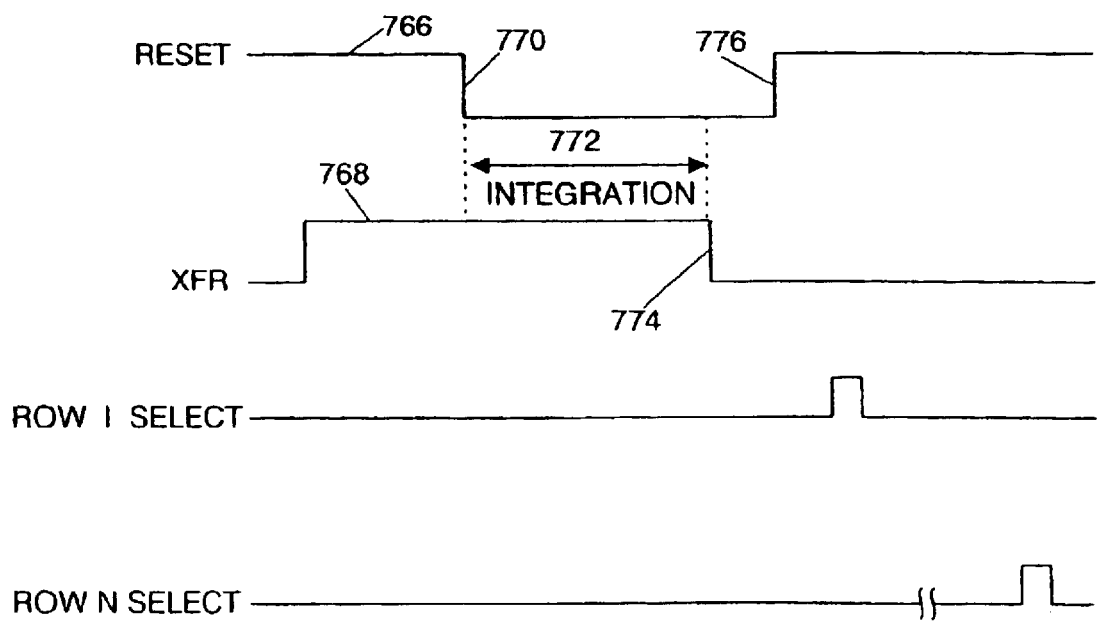
FIG. 7 illustrating a timing diagram showing operation of the active pixel sensor depicted in FIG. 6.

To better understand the operation of the active pixel sensor 650, the timing diagram of FIG. 7 illustrates the timing of RESET, XFR, and ROW-SELECT signals depicted in FIG. 6. Active pixel 650 is reset by turning on both N-channel MOS reset transistor 654 and N-channel MOS transfer transistor 656 as shown by the HIGH level of both the RESET and the XFR signals at 766 and 768. Then the N-channel MOS reset transistor 654 is turned off at the falling edge 770 of RESET 766 so that the integration of photocurrent from photodiode 652 can begin. The photocurrent integration period is indicated by reference numeral 772.

While N-channel MOS transfer transistor 656 is turned on, the capacitance of storage element 658 adds to the capacitance of photodiode 652 during integration, thereby increasing the charge capacity and the range of active pixel sensor 650. This also reduces variation in the pixel output due to capacitance fluctuations since gate oxide capacitance from which storage element 658 is formed is better controlled than well capacitance of photodiode 652.

When the integration is complete (determined by the external exposure control), the N-channel MOS transfer transistor 656 turns off at falling edge 774 of XFR to isolate the voltage level corresponding to the integrated photo-charge onto storage element 658. Shortly thereafter, photodiode 652 itself is preferably reset to the reference voltage by again turning on N-channel MOS reset transistor 654 as indicated by rising edge 776 of RESET. This action will prevent photodiode 652 from continuing to integrate during the readout process and possibly overflowing excess charge into the body, possibly affecting the integrity of the signal on storage element 658.

After the N-channel MOS transfer transistor 656 is turned off, the read out process can begin. Each of the active pixel row sensors in a row is read when a Row-select signal pulse as shown in FIG. 7 is applied to the gate of N-channel MOS row-select transistor 664 in an active pixel sensor 650. In the operation of active pixel sensor 650, a voltage related to the voltage found on storage node 662 is sensed by N-channel MOS readout transistor 660 and placed on column output line when the N-channel MOS row-select transistor 664 is turned on. The XFR signals stays low until all of the rows have been read out or another cycle is initiated.

Figure 8:
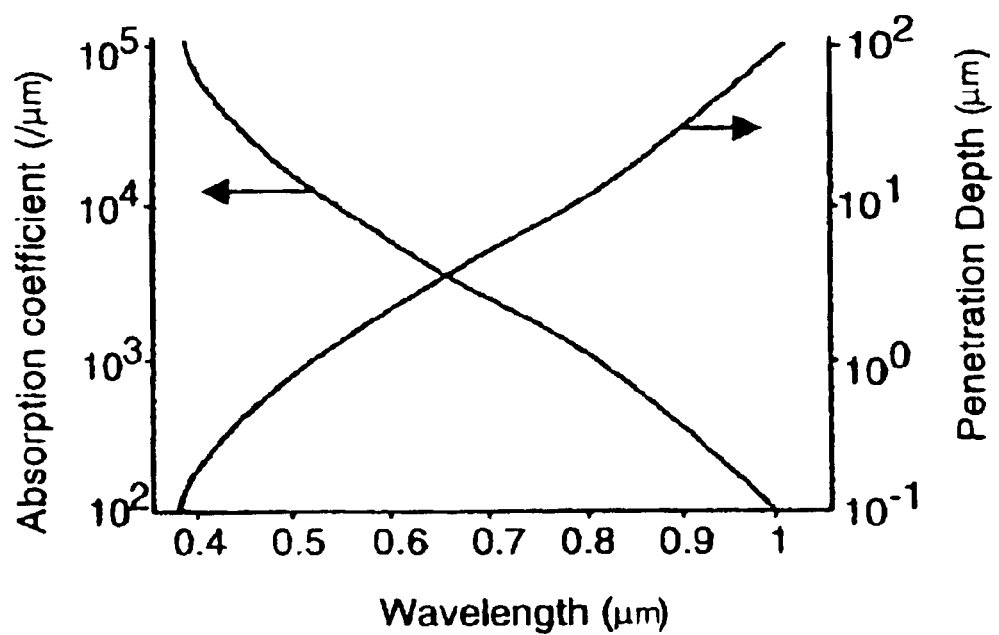
FIG. 8 illustrating a graph plotting light absorption depth in silicon versus wavelength.

FIG. 8 illustrates the light absorption length in silicon of light in the visible spectrum. It is well known that the longer the wavelength of light incident upon the silicon body, the deeper the light will penetrate into the silicon body before it is absorbed. As depicted, the blue light having wavelengths in the range of about 400–490 nm will be absorbed in a silicon body at a depth of about 0.2–0.05 microns, green light having wavelengths of about 490–575 nm will be absorbed in the silicon body at a depth of about 0.5–1.5 micron, and red light having wavelengths in the range of about 575–700 nm will be absorbed in the silicon at a depth of about 1.5–3.0 microns.

Figure 9:
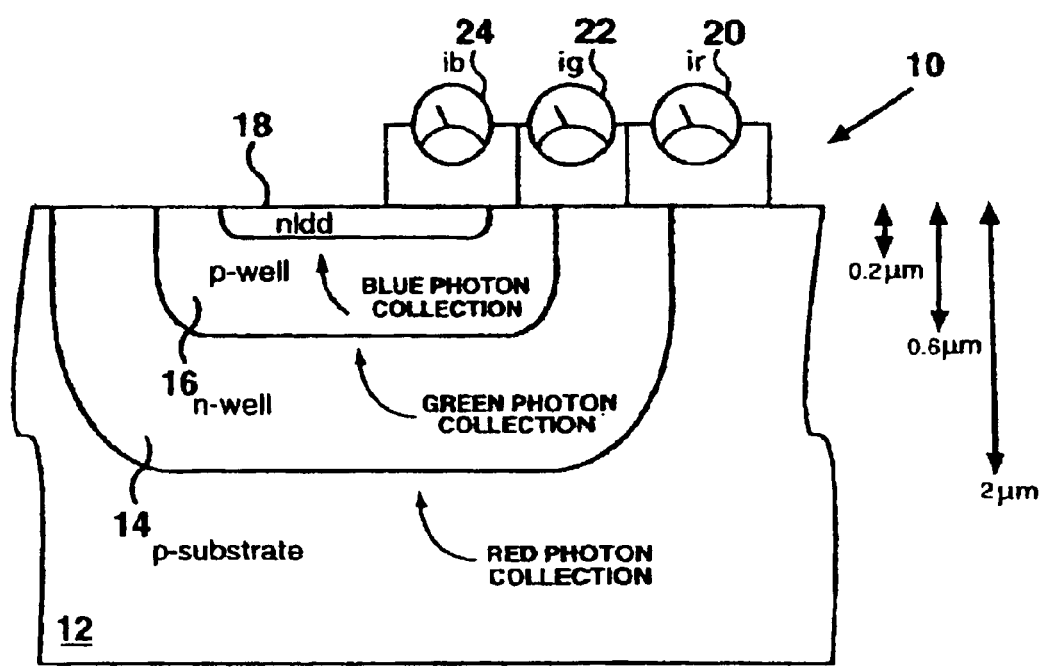
FIG. 9 illustrating a partial cross sectional view of a conventional three-color vertical-color-filter pixel sensor using a triple-junction structure.

FIG. 9 illustrates a first illustrative and non-limiting example of a color detector group that can be used to practice the present invention. The cross-sectional view shows a prior-art vertical-color-filter detector group 10 of the type disclosed in U.S. Pat. No. 5,965,875 to Merrill. FIG. 9 shows a vertical-color-filter detector group structure fabricated in a triple-well process wherein the blue, green, and red sensors are disposed at different depths beneath the surface of the semiconductor substrate 12 upon which the imager is fabricated. As may be seen from an examination of FIG. 9, the red photodiode is comprised of the junction between the p-type substrate 12 and the n-type well 14, the green photodiode is comprised of the junction between the n-type well 14 and the p-type well 16, and the blue photodiode is comprised of the junction between the p-type well 16 and the n-type lightly-doped-drain implant 18 at the surface of the substrate. Photocurrent is sensed from the red, green, and blue photodiodes as indicated symbolically by current meters 20, 22, and 24, respectively. The photodiodes in the vertical-color-filter pixel sensor of FIG. 9 are connected directly to one another in series and are thus of alternating polarity.

Figure 10:
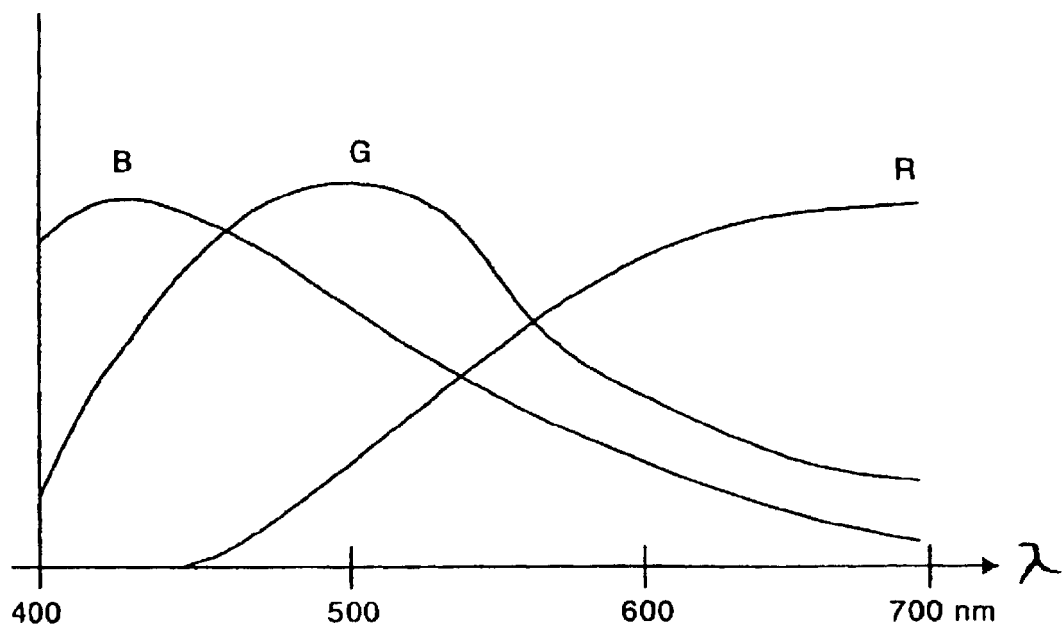
FIG. 10 is a graph showing a set of estimated sensitivity curves for the FIG. 9 triple-junction photodiode structure.

FIG. 10 presents a set of estimated sensitivity curves for the triple-stacked photodiode arrangement of this invention, as a function of wavelength within the visible spectrum. The curves are only rather broadly tuned, as shown, rather than sharply tuned as in some color separation approaches that are based on color filters. However, as is well known in the art of color imaging, it is possible with suitable matrixing to convert three-color measurements from such a set of curves into a more nearly colormetrically correct set of red green, and blue intensity values. Methods for estimating suitable matrix transformations are known in the art, and are disclosed, for example in U.S. Pat. No. 5,668,596, entitled "Digital Image Device Optimized for Color Performance."

Figure 11A:
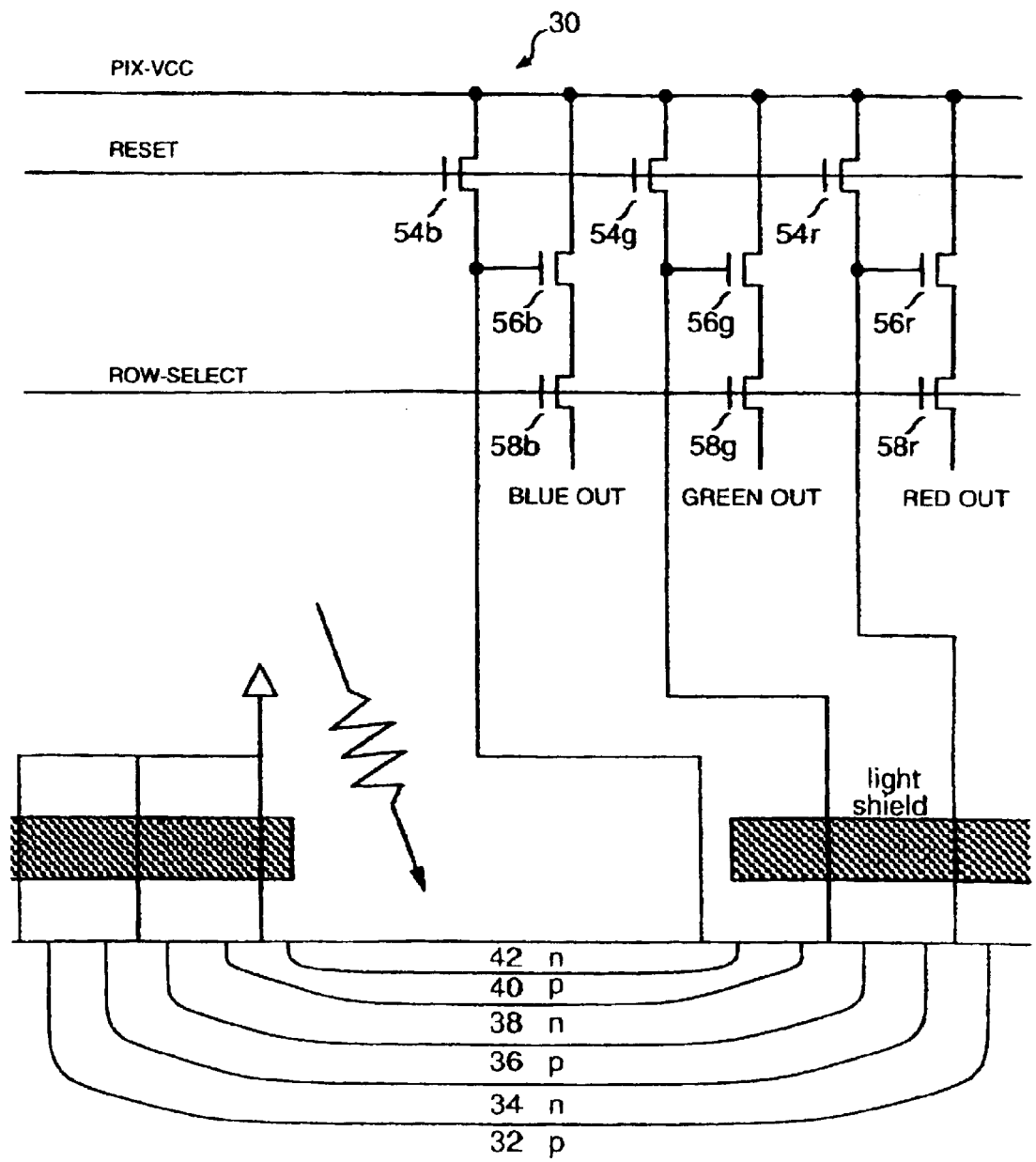
FIG. 11A illustrating a combination semiconductor cross sectional diagram and schematic diagram of an illustrative vertical-color-filter pixel sensor.

FIG. 11A illustrates a second illustrative and non-limiting example of a vertical-color-filter detector group that may be used to practice the present invention. Vertical-color-filter detector group 30 is a six-layer structure that is shown schematically in cross-sectional view fabricated on p-type semiconductor substrate 32. This type of vertical-color-filter detector group has three n-type regions, isolated vertically by p-regions that are all connected to the substrate potential.

The vertical-color-filter detector group of the present invention can be fabricated in a number of different ways and is thus generally shown in FIG. 11A.

The vertical-color-filter detector group depicted in FIG. 11A employs a six-layer structure, wherein the blue, green, and red photodiode sensors are disposed at different depths beneath the surface of the semiconductor structure. In comparison to the structure of FIG. 9, the addition of the extra layers results in a structure in which the red, green, and blue photocurrent signals are all taken from the n-type cathodes of three isolated photodiodes. This is shown schematically in FIG. 11B, which depicts the same vertical-color-filter detector group as shown in FIG. 11A.

Figure 11B:
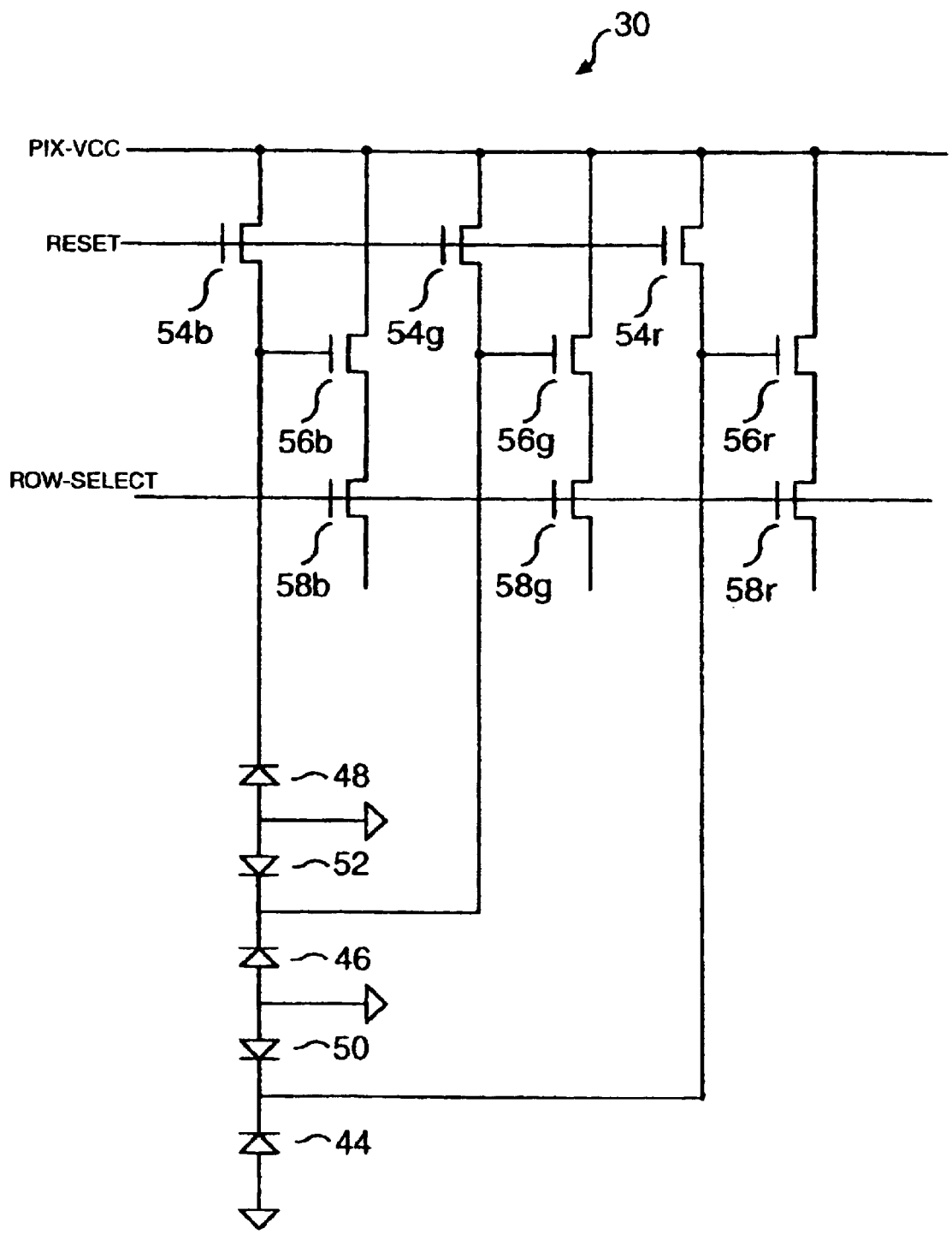
FIG. 11B illustrating a schematic diagram depicting the same vertical color pixel sensor as shown in FIG. 11A in which the photodiodes are represented schematically as semiconductor diode symbols.

In FIG. 11B, the photodiodes are represented schematically as semiconductor diode symbols. Both FIG. 11A and 11B show a non-storage version of a vertical-color-filter detector group in which each of the red, green, and blue photodiodes is coupled to a transistor circuit. Each circuit has a reset transistor 54 driven from a RESET signal line and coupled between the photodiode cathode and a reset potential, a source-follower amplifier transistor 56 coupled to the photodiode cathode, and a row-select transistor 58 driven from a ROW-SELECT signal line and coupled between the source of the source-follower amplifier transistor and a row line. The suffixes "r," "g," and "b" are used to denote the color associated with each transistor. As is known in the art, the RESET signal is active to reset the pixel and is then inactive during exposure, after which the row-select line is activated to read out the pixel location data.

Figure 11C:
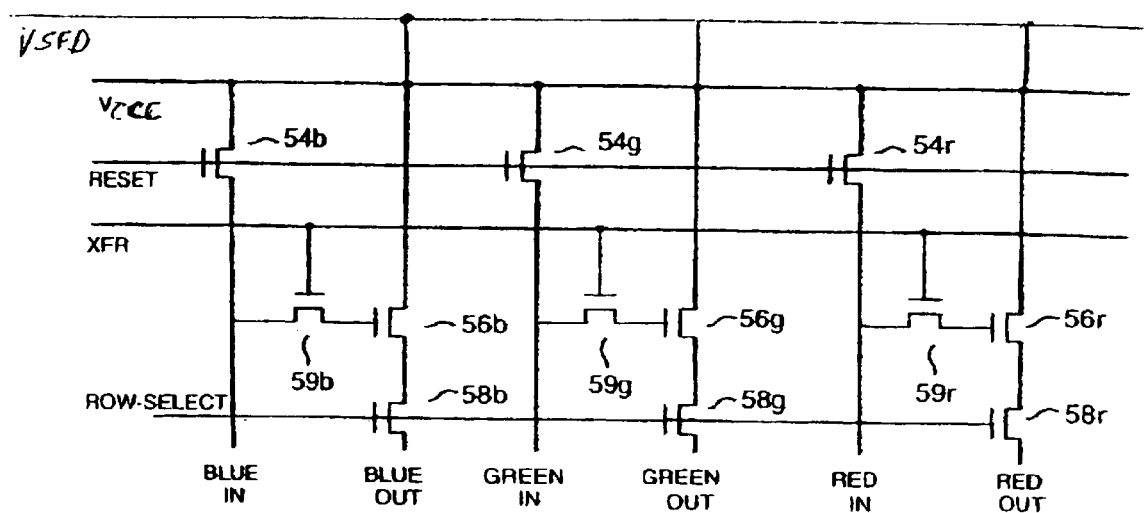
FIG. 11C illustrating a schematic diagram depicting transistor circuitry that may be used in a storage version of the vertical-color-filter pixel of the present invention to which the red, green, and blue photodiodes are coupled.

Referring now to FIG. 11C, a schematic diagram depicts transistor circuitry that may be used in a storage version of the vertical-color-filter detector group of the present invention to which each of the red, green, and blue photodiodes is coupled. As will be appreciated by persons of ordinary skill in the art, the transistor circuit of FIG. 11C includes an additional transfer transistor 59 not found in the circuits of FIG. 11A and 11B. The gate of transfer transistor 59 is coupled to a XFR line that is held active for at least part of the time that the RESET line is active and goes inactive at the end of the exposure time, after which the row-select line is activated to read out the pixel data. One advantage of the circuit of FIG. 11C is that the use of the transfer transistors eliminates the need for a mechanical shutter.

Another difference in the schematic diagram of FIG. 11C is that the drains of amplifier transistors 56b, 56g, and 56r are source-follower transistors connected to a VSFD line instead of to $V_{cc}$. The voltage potential VSFD may be held fixed at a supply voltage V+ (which may be, for example, about 1–3 volts depending on the technology) or may be pulsed.

To increase input-to-output voltage gain of source-follower transistors 56b, 56g, and 56r, it is possible to pulse their drain terminals. If the VSFD signal at the drains of the source-follower transistors 56b, 56g, and 56r is pulsed, current will flow only when it is high. It may be advantageous to pulse the drains of the source-follower transistors 56b, 56g, and 56r with a low duty cycle to save power during exposure. Pulsing the drains of the source-follower transistors 56b, 56g, and 56r also keeps the photodiode voltages lower during the time that the drain is low, which can beneficially reduce voltage-dependent leakage at those nodes.

There are several advantages obtained by use of the vertical-color-filter detector group of this invention. First, only NMOS transistors are used in the sensing circuitry, which compared to a structure that would use opposite polarity transistors of green channel, has one half the control wires for a given pixel configuration, and occupies much less space because n-wells are not needed for PMOS devices as in prior-art schemes. The simplest pixel support needed for the vertical-color-filter detector group of the present invention requires only a total of six array wires running across the sensors.

From the disclosure of this illustrative embodiment of the three-color-vertical-color-filter detector group of the present invention, persons of ordinary skill in the art will recognize that additional colors and/or other colors may be sensed according to the present invention by adding additional layers and/or changing the junction depths.

In addition, there is no image lag associated with the barrier gate mode that is sometimes used with pixel sensors. There is no interaction between red, green, and blue photodiodes because of the isolation between sensors provided by the alternating-polarity diodes present in the structure.

None of the problems associated with complementary array support circuits, such as phase lag associated with digital and analog level shifters, are present in the pixel sensor of the present invention. Finally, the junction depths of each pixel sensor of the present invention may be more closely matched to the optimal junction depths of absorption of the red, green, and blue wavelengths, as shown in Table 1.

TABLE 1 junction depths for blue, green, and red detectors

| Color | Wavelength | Optimal junction depth | Triple-Well CMOS | Present Invention |
| --- | --- | --- | --- | --- |
| Blue | 450 | 0.1–0.4 | 0.15 | 0.1–0.4 |
| Green | 550 | 0.8–1.2 | 0.5 | 0.8–1.2 |
| Red | 650 | 1.5–3.5 | 1.1 | 1.5–3.5 |

From the disclosure herein, those skilled in the art will recognize that there are numerous ways to realize the vertical-color-filter detector group of the present invention in a semiconductor structure. In one illustrative embodiment of this invention, the six-layer structure of alternating p-type and n-type regions can be formed using a semiconductor substrate as the bottom layer and forming five concentric wells of alternating conductivity type in the substrate.

In another illustrative embodiment of the present invention shown schematically in FIG. 11, the six-layer structure of alternating p-type and n-type regions can be formed using a semiconductor substrate 60 of a first conductivity type as the bottom layer, in which a blanket boron diffusion 62 and a single doped region 64 of a second opposite conductivity type are disposed. The diffusion barrier 62 prevents carriers generated in the substrate from migrating upward to the green photodiode and provides isolation between the red photodiodes. The doped region 64 acts as the detector for the red photodiode. In this embodiment of the invention, a first epitaxial layer 66 having the first conductivity having a blanket diffusion-barrier implant 68 of the first conductivity type is disposed over the surface of the semiconductor substrate 60 and the doped region 64 and a doped region 70 of the second conductivity type is disposed in the first epitaxial layer 66. The diffusion barrier implant 68 prevents carriers generated in the first epitaxial layer 66 from migrating upward to the blue photodiode and provides isolation between green photodiodes. The doped region 70 acts as the detector for the green photodiode. A second epitaxial layer 72 of the first conductivity type is disposed over the surface of the first epitaxial layer 66 and its doped region 70 and a doped region 74 of the second conductivity type (which may be a lightly-doped-drain implant) is formed in the second epitaxial layer 72. Doped region 74 forms the blue detector.

Contact is made to the buried green detector 70 and the buried red detector 64 via deep contact plugs. The contact plug for the buried green detector 70 is formed through second epitaxial layer 72 and the contact for the buried red detector 64 is formed through second eptiaxial layer 72 and through first eptiaxial layer 66 as will be described further herein.

Figure 12:
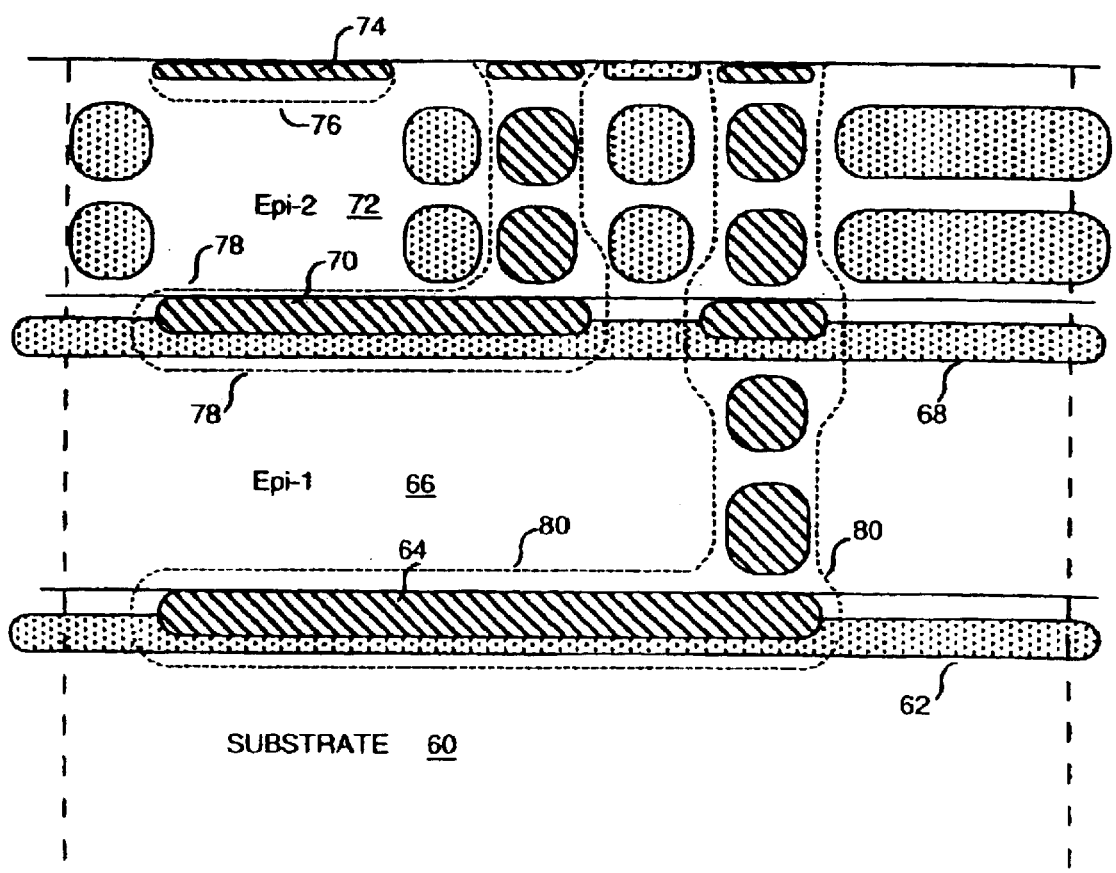
FIG. 12 illustrating a cross sectional diagram showing a vertical-color-filter pixel sensor employing epitaxial semiconductor technology.

The hatched areas of FIG. 12 show the approximate location of the implants used to create the p-type and n-type regions of the structure. The dashed line 76 defines the approximate border between the net-P and the net-N doping for the blue detector 74. Similarly, the dashed line 78 defines the approximate border between the net-P and net-N doping for the green detector 70. The dashed line 80 defines the approximate border between the net-P and net-N doping for the red detector 64 with its vertical portion to the surface of the second epitaxial layer 66 forming the contact to the red detector 64.

As may be seen from the above recited illustrative examples, other embodiments of the six-layer structure disclosed herein are contemplated to be within the scope of the present invention and may be realized by using various combinations of layers selected from among the substrate, one or more epitaxal layers, and one or more doped regions disposed in one or more epitaxial layers.

Persons of ordinary skill in the art will observe that all of the red, green, and blue photodiodes (indicated at reference numerals 64, 70, and 74, respectively in FIG. 12) can be operated so that the depletion regions of the photodiodes do not interact (i.e. they are well isolated) but may be alternatively operated either through control of doping levels, structure spacing or operating voltages such that depletion regions do interact and may also be deeply depleted.

An illustrative semiconductor fabrication process for fabricating the vertical-color-filter detector group of FIG. 12 is disclosed with reference to FIGS. 13A through 13E, cross sectional diagrams showing the structure resulting after completion of selected steps in the process.

Figure 13A:
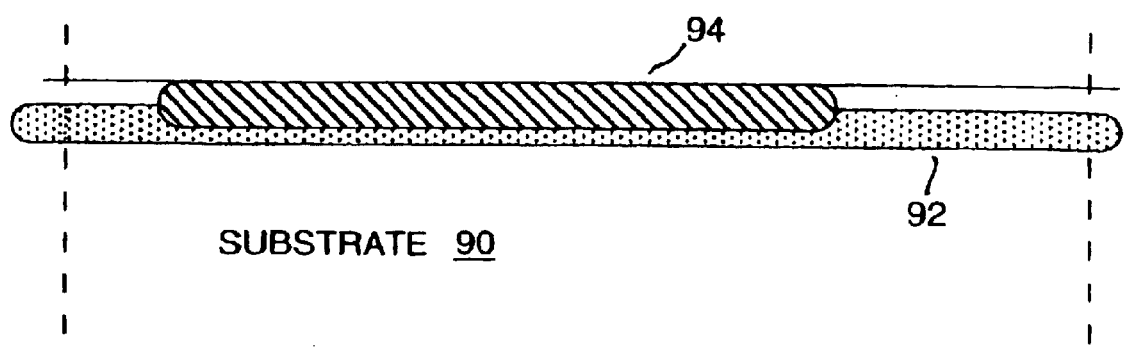
FIG. 13A through 13E illustrating cross-sectional diagrams showing the structure resulting after completion of selected steps in a fabrication process.

The process starts with a 1e15 p-type substrate 90 shown in FIG. 13A. A blanket boron implant (shown at reference numeral 92) is performed to a depth of about 0.5 um. This boron implant must be more heavily doped than the substrate because it acts as a weak diffusion barrier to prevent electrons generated in substrate 90 from diffusing up the green photodiode, as well as separating the red photodiodes, this blanket implant should generally be anywhere from about 3× to 100× of the substrate doping level and in one embodiment of the invention is about 1e16. Next, an implant-masking layer (not shown) is then applied using conventional photolithographic techniques. Next, as shown in FIG. 12A, a masked phosphorus 1e17 implant (shown as reference numeral 94) is performed at an energy level around 50 keV followed by an activation cycle as is known in the art to form the n-type layer of the red detector. This implant dose should be sufficient to over compensate the blanket p-type implant. Persons of ordinary skill in the art will appreciate that the drive cycle must ensure adequate annealing for both the boron and phosphorous implant prior to growth of an epitaxial silicon layer. Persons skilled in the art will also recognize that the order of p-type blanket implant and the n-type masked implant to form the red photodiode n-type region could be reversed.

Figure 13B:
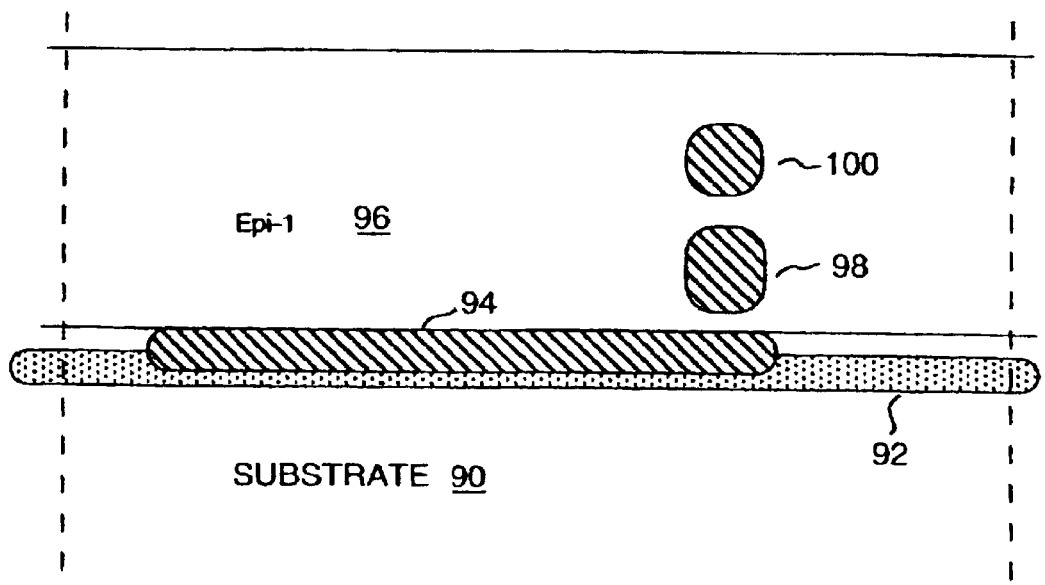

Referring now to FIG. 13B, next, a layer of 1e15 p-type epitaxial silicon 96 is grown to a thickness of about 2.0 um. The dopant concentration in the epitaxial layer 96 is as lightly doped as will guarantee p-type material in order that it will function as a potential well region so that photoelectrons generated therein do not diffuse past the p-type layers above or below it. Punch-through from red to green photodiodes is another design constraint affecting doping level in this layer, i.e. the doping needs to be sufficient to prevent depletion regions from the red and green photodiode cathodes from getting too close to each other, or fully depleting the p-type region between them.

Next, a plug implant-masking layer (not shown) is then applied using conventional photolithographic techniques. A 1e17 phosphorus plug implant and an anneal sequence is then performed to form a plug contact to the cathode of the red photodiode. This plug implant should be a high-energy implant (i.e. about 1000 KeV) or should comprise multiple implant steps at different energies. In one embodiment of the present invention, a tall, thin plug is formed by a combination of two different implants, one a high-energy implant 98 (i.e. about 1200 KeV) for deep doping the bottom region of the plug contact, and the other a lower-energy implant 100 (I.e. about 600 KeV) for doping the intermediate region of the plug contact, followed by a third implant or diffusion that is performed along with the doping for the green photodiode to complete the shallow surface region of the plug contact.

The plug resistance is not important since the photocurrent is small, however the size of the plug should be as small as possible to minimize pixel area and maximize fill factor. A plug size of 1 micron is a good target, but the depth of the plug contact needs to be about 2 microns. The multiple-implant plug disclosed herein makes it possible to achieve such a plug with depth greater than its width.

Figure 13C:
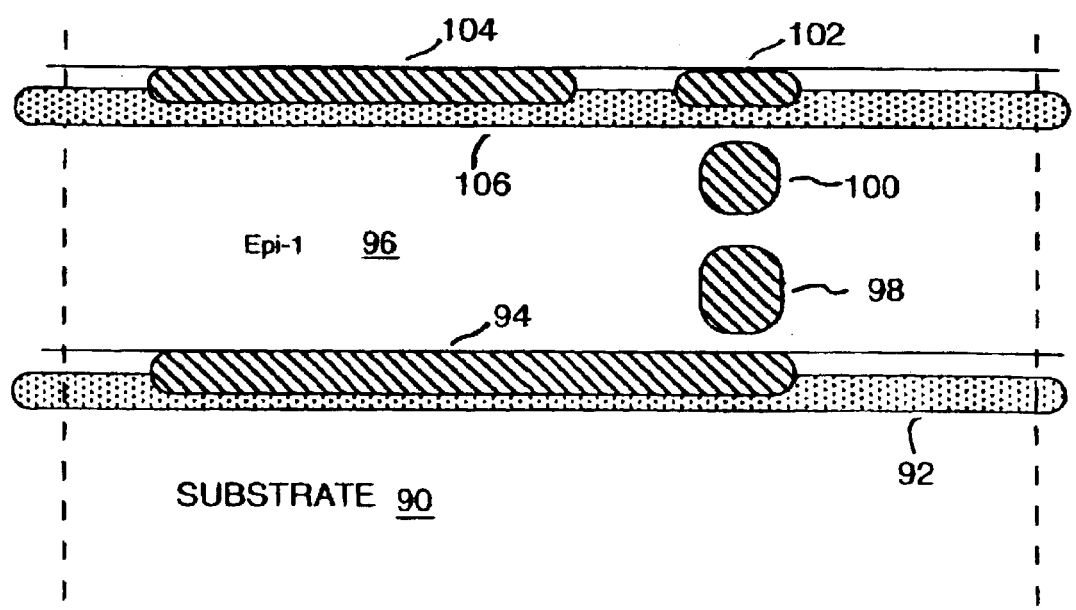

Referring now to FIG. 13C, an implant-masking layer (not shown) is then applied using conventional photolithographic techniques. A 1e17 phosphorous implant at energy of around 50 KeV (shown at reference numeral 104) and activation sequence is then performed to form the n-type layer for the green detector. A second, smaller aperture in this masking layer serves to form the surface region 102 of the plug contact implant for contact to the underlying cathode of the red detector. As persons of ordinary skill in the art will appreciate, this implant requires activation drive to restore lattice integrity before the subsequent epitaxial layer deposition step.

Next, a blanket boron implant 106 of epitaxal layer 96 is performed. This implant serves to counteract autodoping during the subsequent epitaxial layer deposition step. This implant also serves as a weak diffusion barrier to prevent green photo-generated carriers from diffusing upward to the blue detector and separates the green photodiodes. This blanket implant 106 should generally be anywhere from about 3× to 100× of the doping level of the first epitaxial layer 96 and in one embodiment of the invention is about 1e16. Person of ordinary skill in the art will also recognize that the order of the p-type blanket implant and the n-type photodiode region could be reversed, and that the doping concentration considerations are similar to those described above for the red photodiode.

Figure 13D:
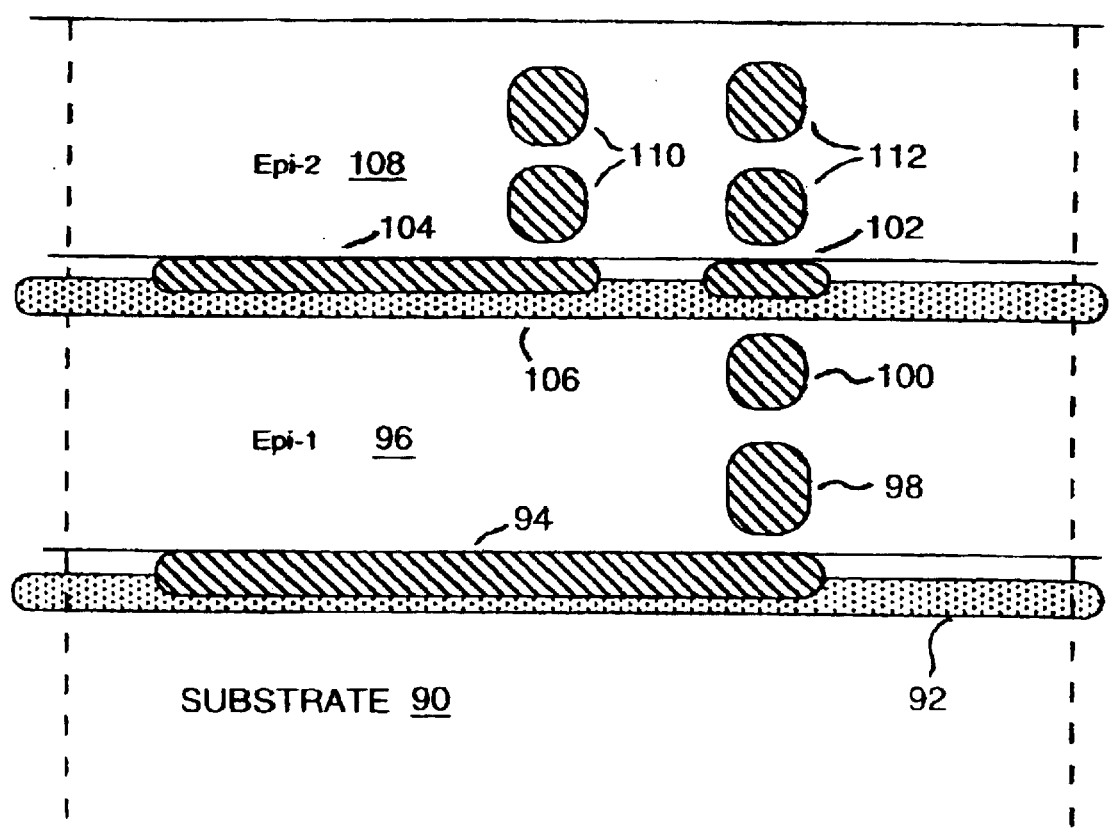

Referring now to FIG. 13D, a layer of 1e15 p-type epitaxial silicon 108 is grown to a thickness of about 0.7 to 1.0 um. An implant-masking layer (not shown) is then applied using conventional photolithographic techniques. A standard CMOS n-well implant is performed to form n-well regions 110 to make contact to cathode 104 of the underlying green detector and n-well region 112 to make contact to the top of the plug contact 102 from the cathode 94 of the bottom red detector. The n-well regions 110 and 112 may require a double implant to reach the buried layers comprising the cathode 106 of the green detector and the plug contact for the cathode 94 of the red detector; typical CMOS n-well implant energies are around 500 KeV and 100 KeV, respectively, for the deep and shallow implants in n-well regions 110 and 112.

Figure 13E:
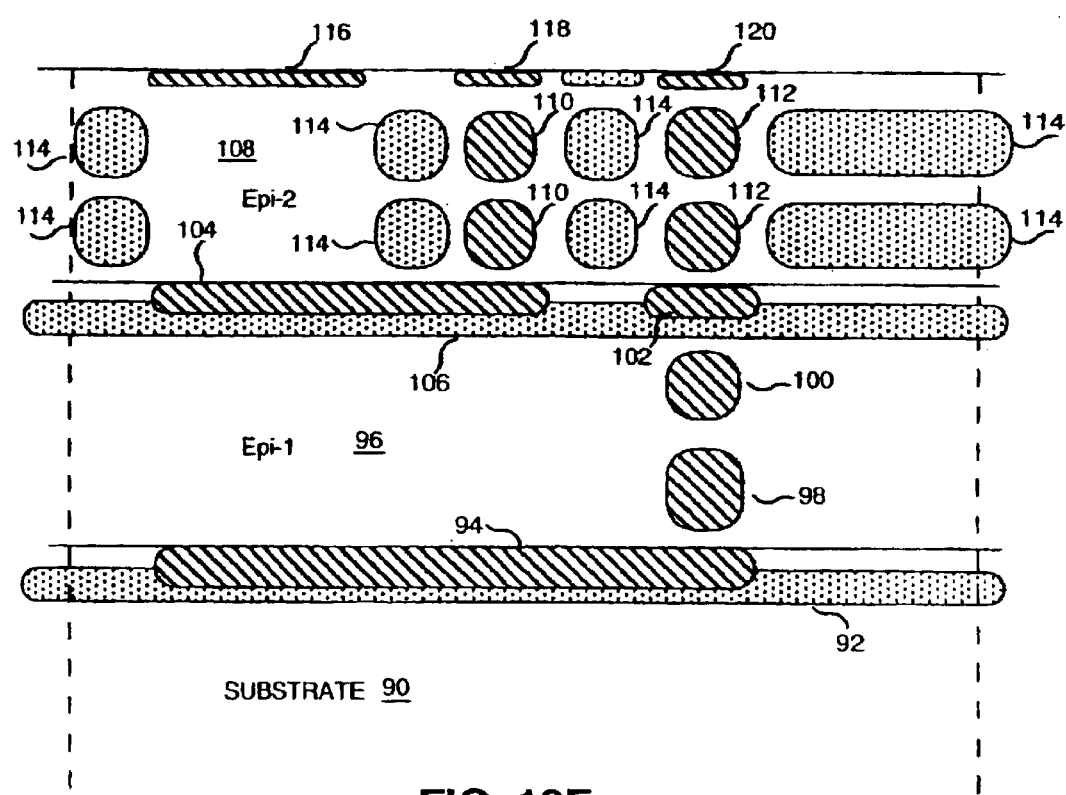

Referring now to FIG. 13E, an implant-masking layer (not shown) is then applied using conventional photolithigraphic techniques. A CMOS p-well implant step is then performed to create p-well regions 114. As will be understood by persons of ordinary skill in the art, the CMOS p-well implant step may require a double energy implant to minimize the n-well to n-well spacing. These p-well regions 114 are for isolation between contacts for the red and green detector plugs as well as between adjacent vertical-color-filter detector groups (the rightmost and leftmost edge p-well regions.) in addition, this p-well implant is used to create wells in which NMOS transistors for the rest of the circuitry on the chip will be formed.

Next, an implant-masking layer (not shown) is then applied using conventional photolithographic techniques. A lightly doped drain implant shown at reference numeral 116 is then performed to form the cathode of the blue detector. In one embodiment, other apertures in this masking layer form surface portions of the deep contact regions for the red and green detectors, to allow good electrical contact to an overlying metal interconnect layer. Alternatively, more heavily doped n-type regions may be formed in a separate processing step to form surface portions 118 and 120 of the deep connect regions for the red and green detectors as well as a contact region within the lightly doped implant for the blue detector. As an optional alternative to the illustrative process depicted in FIG. 13E, the cathode of the blue detector might be formed with a p-well underneath (i.e. an extension of regions 114).

The process employed for fabricating the vertical filter sensor group of the present invention is compatible with standard CMOS processes. The additional process steps are all performed prior to the standard CMOS steps, thus minimizing interactions.

Two epitaxial layers 96 and 108, as sometimes employed in BiCMOS, are required, as well as two extra implant activation cycles, one before each epitaxial step. As will be apparent to such persons of ordinary skill, three extra masks are required in the process for implanting the n-type regions 94, 98, 100, 102, and 104 for the red detector, the red contact plug, and the green detector. The process requires five extra implants including the red detector counterdoping 92 and green detector counterdoping 106 (six extra implants are required if regions 98 and 100 are formed separately). The masking, implanting, drive-in and anneal, and epitaxial growth fabrication process steps described above for fabricating the novel structure disclosed herein are individually well known to persons of ordinary skill in semiconductor processing art for fabricating other semiconductor devices. Process parameters, such as times, temperatures, reactant species, etc. will vary between individual processes but are known for use in such processes. Such details will not be recited herein to avoid overcomplicating the disclosure and thus obscuring the invention.

The fabrication process disclosed herein provides several advantages. There are no large lateral diffusions associated with implant and drive wells, resulting in a smaller pixel area. The vertical plugs needed to connect buried layers can be small.

As shown, this six-layer three-color vertical-color-filter detector photodiode structure uses two epitaxial layers, as are sometimes found in BiCMOS processes. Silicon quality generally improves, as more epitaxial layers are grown. In addition, the sensor group including pixel readout circuits according to this embodiment of the present invention can be made in any BiCMOS fabrication facility. The topmost layers may be formed using conventional CMOS process, (i.e. n+, n-well, and p-well). In addition, the layer referred to herein as the substrate may itself be an epitaxial layer formed on an underlying substrate.

Figure 14:
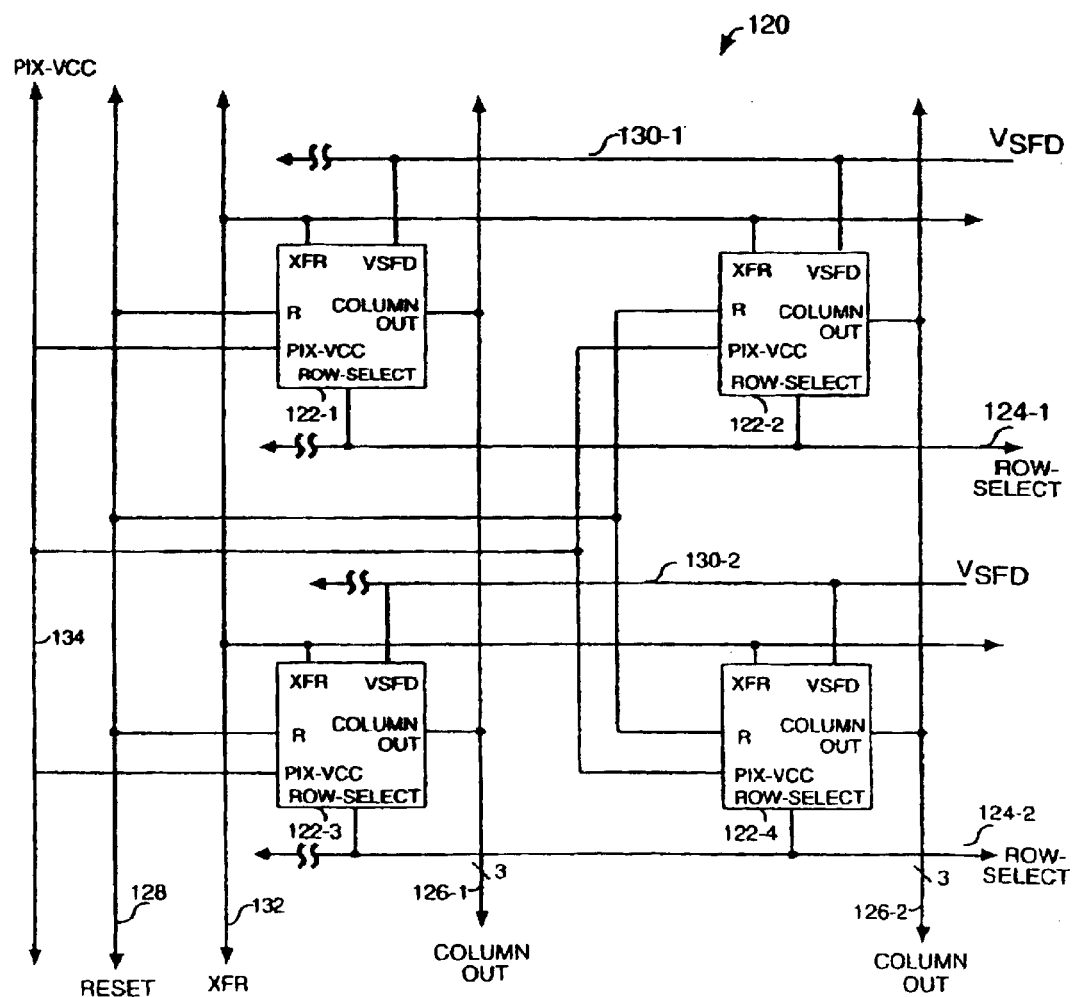
FIG. 14 illustrating a diagram of an imaging array in accordance with this invention.

Referring now to FIG. 14, a diagram shows an illustrative 2 by 2 portion 120 of an array of vertical-color-filter detector groups that may be used in accordance to the present invention. Persons of ordinary skill in the art will readily appreciate that the array portion disclosed in FIG. 14 is illustrative only and that arrays of arbitrary size may be fabricated using the teachings herein. The illustrative array example of FIG. 14 employs circuitry with a storage feature such as is depicted in FIG. 11C including a transfer transistor and so includes a global transfer signal line serving the array. Persons of ordinary skill in the art will appreciate that arrays employing circuitry similar to that depicted in FIGS. 11A and 11B without storage and thus without a transfer transistor are also contemplated as within the scope of the present invention and that such arrays will not include a transfer signal line.

Common RESET and XFR lines can be provided for all of the vertical-color-filter detector groups in the array. As presently preferred a separate VSFD line is provided for each row in the array, although embodiments of the present invention having a single VSFD node are also contemplated. For an example of a VSFD line used in a vertical-color-filter array refer to co-pending application Ser. No. 09/492,103 titled "Active Pixel Sensor with Bootstrap Amplification and Reduced Leakage During Readout" filed on Feb. 14, 2000. The source of the row-select transistor for each color in FIGS. 11A through 11C in a column of the array will be coupled to a separate column line associated with that column and the gate of all row-select transistors for all colors for each vertical-color-filter detector group in a row of the array will be coupled to ROW-SELECT line associated with that row.

The 2 by 2 portion 120 of the array in FIG. 14 includes two rows and two columns of vertical-color-filter detector groups. A first row includes vertical-color-filter detector groups 122-1 and 122-2; a second row includes vertical-color-filter detector groups 122-3 and 122-4. A first column includes vertical-color-filter detector groups 122-1, 122-3; a second column includes vertical-color-filter detector groups 122-2 and 122-4.

A first ROW-SELECT line 124-1 is connected to the row-select inputs (ROW-SELECT) of vertical-color-filter detector groups 122-1 and 122-2. A second ROW-SELECT line 124-2 is connected to the row-select inputs (ROW-SELECT) of vertical-color-filter detector groups 122-3 and 122-4. The first and second ROW-SELECT lines may be driven from a row decoder (not shown) as is well known in the art.

A first set of three (blue, green, and red) COLUMN-OUT lines 126-1 is connected to the outputs of vertical-color-filter detector groups 122-1 and 122-3. A second set of three COLUMN-OUT lines 126-2 is connected to the outputs of vertical-color-filter detector groups 122-2 and 122-4. The first and second sets of COLUMN OUT lines are coupled to sets of column readout circuits (not shown) as is well known in the art.

A global RESET line 128 is connected to the reset (R) inputs of all of the vertical-color-filter detector groups 122-1 through 122-4. A first VSFD line 130-1 is connected to the VSFD inputs of the vertical-color-filter detector groups 122-1 and 122-2 in the first row of the array. A second VSFD line 130-2 is connected to the VSFD inputs of the vertical-color-filter detector groups 122-3 and 122-4 in the second row of the array. A global XFR line 132 is connected to the XFR inputs of all of the vertical-color-filter detector groups 122-1 through 122-4.

A global $V_{ref}$ line 134 is connected to the $V_{ref}$ inputs of all of the vertical-color-filter detector groups 122-1 through 122-4. Alternately, multiple $V_{ref}$ lines (e.g., one for each column) could be provided.

Figure 15A:
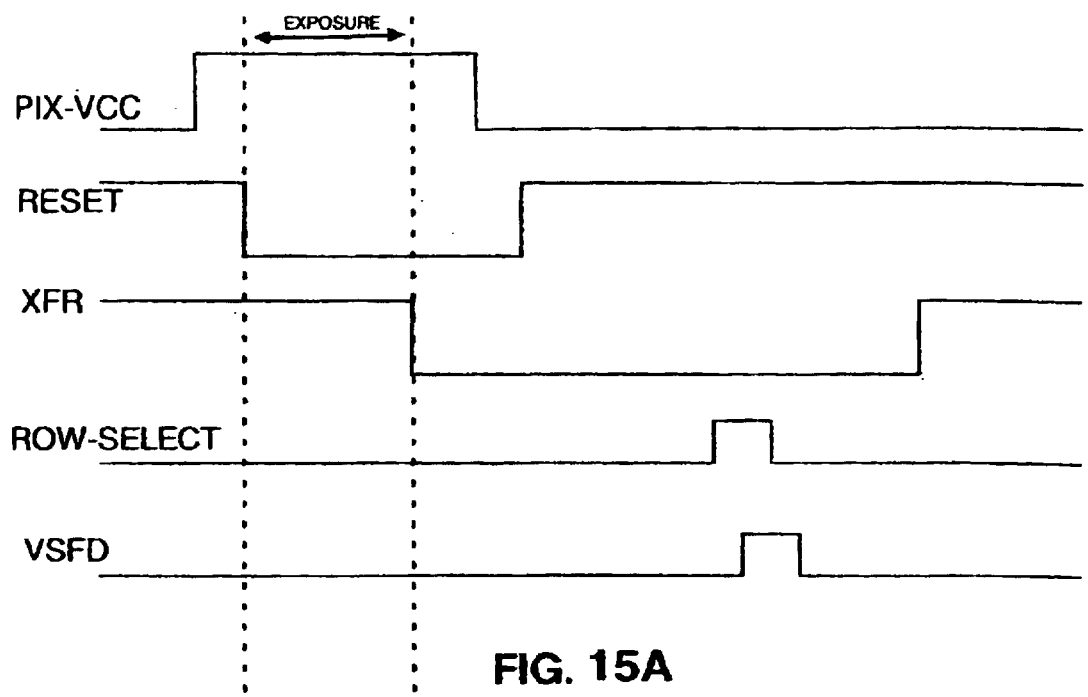
FIGS. 15A and 15B illustrating timing showing the operation of pixel sensors shown in FIGS. 11A, 11B, and 14.

Referring now to FIG. 15A, a timing diagram illustrates the operation of the embodiment of the vertical-color-filter groups shown in FIG. 11C of the present invention. Initially, the RESET signal is asserted high. The drains of the reset transistors 54b, 54g, and 54r are brought to the voltage $V_{ref}$. This action resets all vertical-color-filter detector groups in the array by placing the voltage potential $V_{ref}$ at the cathode of each photodiode. According to one method for operating the vertical-color-filter detector groups of the present invention illustrated in FIG. 15A, the voltage $V_{ref}$ is initially at a low level (e.g. to zero volts) while the RESET is high to reset cathode voltages of all photodiodes in the array to a low value to quickly equalize their states. Then the voltage $V_{ref}$ is raised (e.g. to about 2 volts) for a predetermined time (preferably on the order of a few milliseconds) while the RESET signal is asserted to allow the photodiodes in all vertical-color-filter detector groups to charge up to about 1.4 volts. The black level at photo cathodes is thus set to $V_{ref}$ less a little for capacitive turn-off transient from reset transistors.

When the reset is de-asserted and photo integration begins, charge accumulates on the photodiode cathodes. The voltage at the source of the source-follower transistors 56b, 56g, and 56r, follows the voltage on their gates. In embodiments of the present invention that employ transfer transistors 59b, 59g, and 59r, the XFR signal is asserted throughout the reset period and is de-asserted to end the integration period as illustrated in FIG. 14A. The low level of the XFR signal is preferably set to zero or a slightly negative voltage, such as about −0.2 volts, to thoroughly turn off transfer transistors 59b, 59g, and 59r.

To read out a pixel sensor, the drains of the source-follower transistors 56b, 56g, and 56r are driven to voltage VSFD, the ROW-SELECT signal for the row of the array containing the transistors 59b, 59g, and 59r is asserted, and the output signal is thereby driven onto COLUMN OUT lines. The timing of the assertion of the VSFD signal is not critical, except that it should remain high until after the ROW-SELECT signal is de-asserted as illustrated in FIG. 15A. It may be advantageous to limit the voltage slope at the rising edge of the ROW__SELECT signal if VSFD is raised first, as disclosed in co-pending application Ser. No. 09/492, 103, filed Feb. 14, 2000.

Figure 15B:
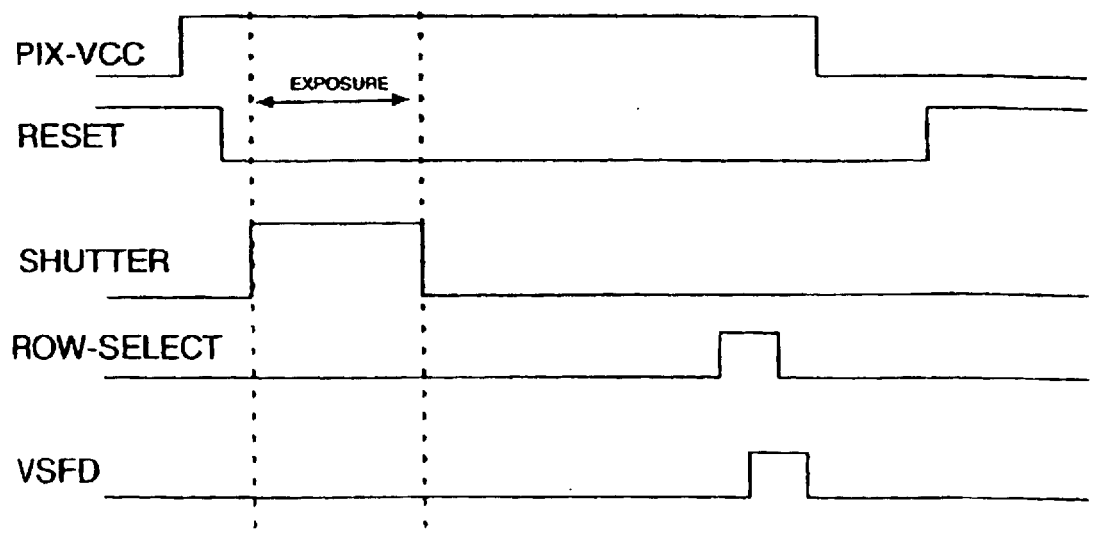

Referring now to FIG. 15B, a timing diagram illustrates one method for operating the sensor group realization of FIG. 11B. The reset operation proceeds as described relative to FIG. 15A. After RESET falls, exposure can begin; however, since without the XFR switch the active pixel sensor does not have electronic shutter capability, it may be the case that a mechanical shutter is used to control exposure. Accordingly, a SHUTTER signal is shown, indicative of a time when a shutter is letting light fall on the sensor.

After the shutter closes, the RESET signal is not re-asserted as it was in FIG. 15A, since the signal needs to remain stored on the photodiode cathodes until after readout. Readout using ROW-SELECT and VSFD works as described with respect to FIG. 15A. After readout, $V_{ref}$ and RESET can be cycled back to their initial states.

As is well known in the art, there are other methods of operating 3-transistor active pixel sensors to avoid the need for a shutter.

The control signals depicted in FIGS. 15A and 15B may be generated using conventional timing and control logic. The configuration of the timing and control logic circuit will depend on the particular embodiment of this invention, but in any event will be conventional circuitry, the particular design of which is a trivial task for persons of ordinary skill in the art having examined FIGS. 15A and 15B once a particular embodiment of this invention is selected.

Figure 16:
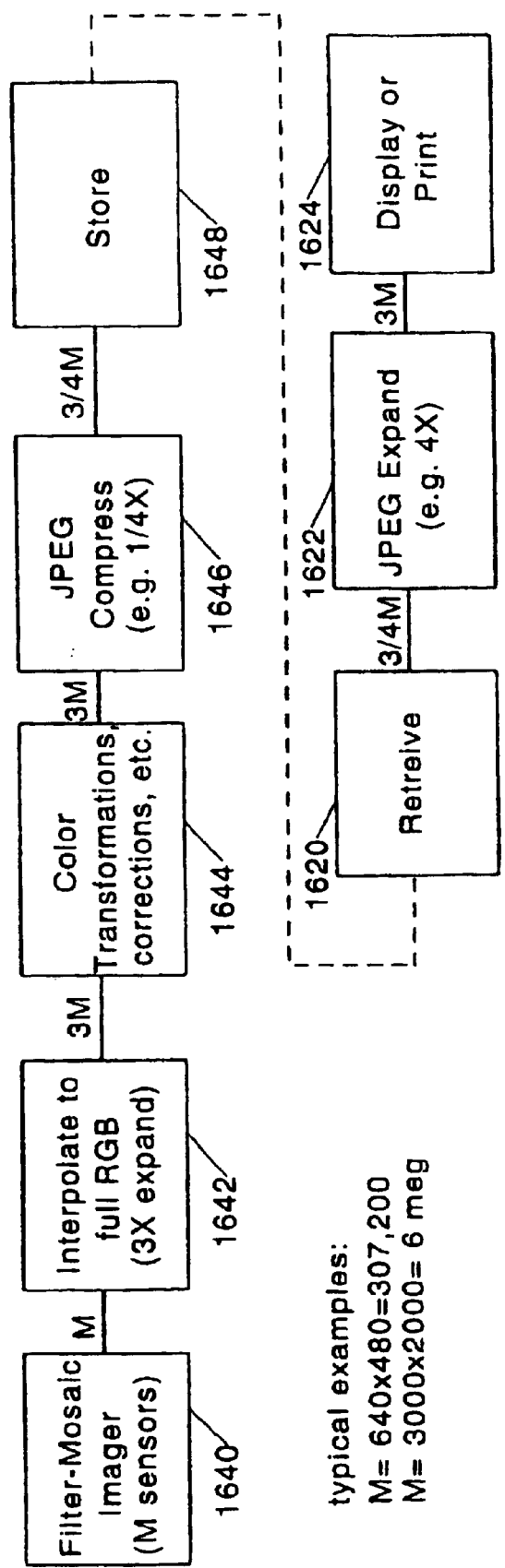
FIG. 16 illustrating a block diagram of a prior art image capture and display system.

Having now fully described the advantages of a full RGB imager, the reader is now directed to FIG. 16 and the storage and retrieval method described therein.

Referring now to FIG. 16, a block diagram of a typical prior art image and display system is shown. An image is first captured by filter-mosaic imager 1640 having M pixel sensors. Color-image sensors in the prior art typically only sense one of the three primary colors at each pixel location, through a mosaic of color filters integrated onto the image sensor chip, in distinction from the full color sensors of the present invention that sense each of the three primary colors at each pixel location. In a typical system, the prior art filter mosaic imager may consist of, for example, an array of 640 pixels sensors by 480 pixels sensors delivering a total of M=307,200 bytes of pixel data. A more dense imager may consist of an array of 3000 pixel sensors by 2000 pixel sensors, for a total of M=6,000,000 bytes of pixel data in the data set. As used herein, a byte may be approximately 8 bits or larger, typically 10 to 14 bits.

The output data set from the pixel sensors in imager 1640 is then processed by interpolator 1642 in order to convert it to a full RGB data set as is known in the art. The interpolation process increases the size of the data set to 3M. Color transformations and corrections are then performed on the data set by color corrector 1644, as is known in the art.

After interpolation and color correction have been performed on the output pixel data set from the imager 1640, data compression, such as JPEG compression, is performed on the data set in data compressor 1646. JPEG compression is an industry standard and results in an adjustable degree of compression for which 0.25× is a typical example, resulting in a decrease in the size of the data set to 0.75 M as shown in FIG. 21.

After the data set has been compressed, the data set may be stored in a storage element 2118. Storage element 2118 has taken numerous forms in the prior art, such as magnetic storage (e.g. floppy disks), or digital semiconductor memory storage such as flash or random access memory.

When it is desired to display or print a stored digital image, the stored compressed data representing the color-corrected image is first retrieved from storage element 2118 by storage retrieval element 1620. The nature of storage retrieval element 1620 depends on the nature of storage element 2118 with which retrieval element 1620 functions, as is appreciated by persons of ordinary skill in the art.

After the stored data set representing the image has been retrieved from storage element 2118 by storage retrieval element 1620, the data set is decompressed by decompression element 1622 as is known in the art and then provided to display or printer 1624 as required by the user.

The image data storage and retrieval method performed by the system of FIG. 16 is easily inferred from the block diagram of FIG. 16. The steps of the image storage and retrieval method performed by the prior-art image and capture and display system will be referred to using the same reference numerals that identified elements performing these steps. Thus, at step 1640, the imager captures an image. Next, at step 1642, the data set representing the image is interpolated to produce a full RGB data set of the image. At step 1646, the data set is compressed and at step 2118 the data set is stored.

When it is desired to display or print a stored digital image, the stored compressed data set representing the color-corrected RGB image is first retrieved from storage at step 1620. The retrieved compressed data set representing the image is then decompressed at step 1622 as is known in the art. Finally, at step 1624, the image data is then provided to display or printer 1624 as required by the user using conventional techniques.

The interpolation step 1642 and the compression step 1646 performed by the prior art scheme depicted in FIG. 16 are "lossy" in that the steps represent a compromise with respect to resolution of the original image data in the data set obtained from the imager 1640. These steps are irreversible in that the original data set taken from the imager 1640 is not recoverable. More importantly, the original data set from imager 1640 is incapable of rendering a complete description of the image falling on the sensor array. It is well known in the art that to achieve complete description of an image, the image must be sampled at least twice in each dimension for each cycle of the highest spatial frequency present in the optical image. The highest spatial frequency is typically set by the modulation transfer function of the lens, which for typical photographic lenses is on the order of one cycle per 10 micrometers. The size of a typical photosensor on a high-density imaging array is about 5 micrometers, so the sampling criterion is just satisfied. However, with a filter mosaic, the repeated unit used to sample the image consists of 4 sensors, and is typically between 10 and 20 micrometers in each dimension. This large sampling interval inevitably results in an irreversible loss of information by confusing higher spatial frequencies with lower spatial frequencies; this problem is known as aliasing. The aliasing artifacts created by this procedure are seen in digital images as moiré patterns on fine-pitched fabrics, or as colored highlights along edges and fine lines. The aliasing artifacts are usually preserved and often accentuated by "lossy" compression techniques and by attempts to sharpen the image.

Figure 17A:
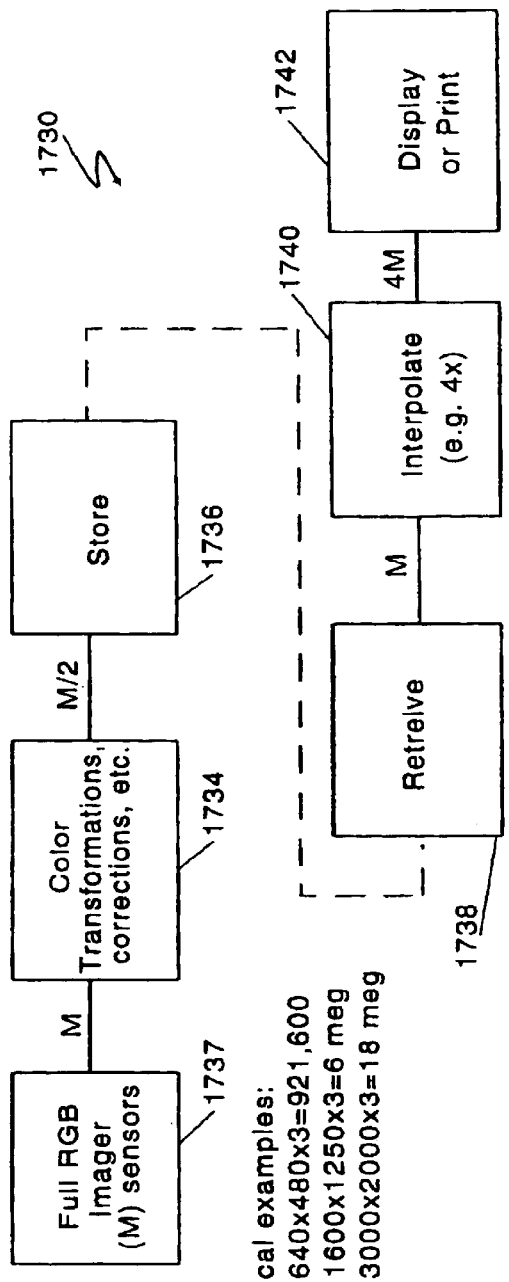
FIGS. 17A, 17B, 18A and 18B illustrating block diagrams of alternate embodiments of an image capture and display system in accordance with this invention.
Figure 17B:
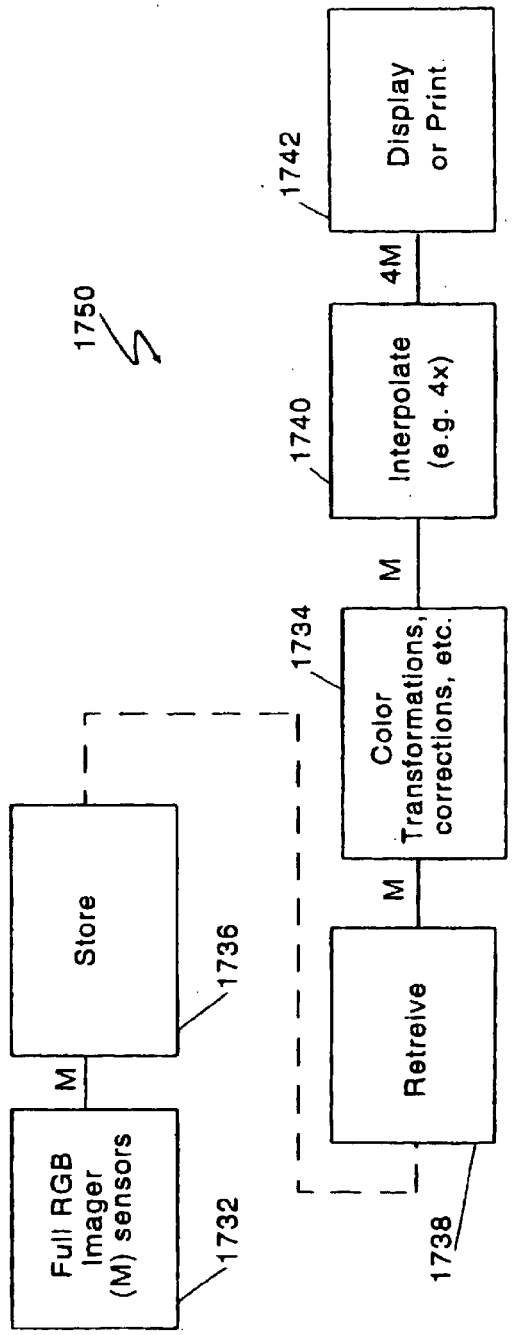

FIGS. 17A and 17B are block diagrams of alternative embodiments of an image capture and display system without compression according to this invention. With reference to FIG. 17A, one embodiment of an image capture and display system 2230 according to this invention is presented.

Image capture and display system 2230 preferably includes full RGB imager 1732, i.e., an imager that senses all three of the primary colors at each pixel location, such as by using an array of the vertical-color-filter-detector groups as shown in FIG. 11A, to produce a full RGB image data set. As will be apparent to one skilled in the art, the full RGB imager 1732 may optimally be located in the imaging device such as a digital camera.

A full-RGB output data set from pixel sensors in imager 1732 is then processed by color corrector 1734 to perform color transformations and corrections. Color corrector 1734 may be configured as in the prior art example shown in FIG. 16 and the structure and operation of the color corrector are therefore familiar to persons of ordinary skill in the art. Examples of color transformations and corrections that may be performed by color corrector 1734 are dark signal subtraction, matrixing, bad pixel replacement, linearization, and gamma encoding. Color correction is optional and need not be performed according to the present invention if unnecessary.

After color correction has been performed on the RGB data set from the imager 1732 of the present invention, the color-corrected data set may be directly stored in storage element 1736. Storage element 1736 may take numerous forms, such as magnetic storage (e.g. floppy disks), or digital semiconductor memory storage such as flash or random access memory. Persons of ordinary skill in the art will observe that other storage techniques, such as optical storage, may also be used in the system and method of the present invention, which is not limited to those storage techniques specifically enumerated herein.

When it is desired to display or print a stored digital image according to the system or method of the present invention, the data set representing the stored color-corrected image is first retrieved from storage element 1736 by storage retrieval element 1738. Persons of ordinary skill in the art will appreciate that the nature of the storage retrieval element 1738 depends on the nature of storage element 1736 with which it functions. As a non-limiting example, if the semiconductor memory is employed in the present invention, the conventional memory addressing and reading circuitry will perform the function of storage retrieval element 1738.

After the data set representing the color-corrected image has been retrieved from storage element 1736 by storage retrieval element 1738, it may then be interpolated by interpolation element 1740. According to the present invention, interpolation element 1740 may perform the process of interpolating from sensor resolution to a higher output resolution, for example to prevent pixel artifacts on a print, on the data in the data set prior to display or printing. Interpolation element 1740 may comprise, for example, a microprocessor running interpolation software as would be appreciated by persons skilled in the art. Persons of ordinary skill in the art will recognize that the interpolation step is not necessary to practice the present invention.

Finally, the interpolated data set from the interpolation element 1740 is then provided to display or printer 1742 as required by the user or may be stored or transmitted in this higher resolution form for later use or further processing, as when a photographer delivers an image to a client. Hardware and software techniques for providing image data to printers or displays are well known to persons of ordinary skill in the art The image data storage and retrieval method of the present invention performed by the system 17A is easily inferred from the block diagram therein. The steps of the image data storage and retrieval method performed by the image capture and display system of FIG. 17A will be referred to using the same reference numerals that identified the element performing these steps. Thus, first, at step 1732, the imager captures an image and an image data set is formed. Next, at step 1734, the image data set is then processed to perform color transformation and/or correction if desired. At step 1736, the data set is stored.

When it is desired to display or print a stored digital image, the stored data set representing the color-corrected image is retrieved from storage at step 1738. The retrieved data set representing the stored color-corrected image may then be interpolated at step 1740 if desired. Finally, at step 1742, the image data set is then provided to display or printer 1742 as required by the user and known to persons of ordinary skill in the art.

As may be observed from examination of FIG. 17A, the amount of data M in the data set remains constant throughout the storage and retrieval process until interpolation step 1740 wherein the size of the data set is increased by the interpolation process. In the example given in FIG. 17A, the optional interpolation step increases the amount of data in the image data set from M to 4M. Persons of ordinary skill in the art will recognize that the example shown in FIG. 17A is a non-limiting example, and other interpolation processes performed in accordance with the principles of the present invention will result in increasing the amount of data by factors other than 4.

Referring now to FIG. 17B, a variation on the image capture and display system and method of the present invention of FIG. 17A is presented. Because elements and process steps of the embodiment shown in FIG. 17B are present in the embodiment of FIG. 17A, the same reference numerals used in FIG. 17A will be employed to identify the corresponding elements and elements and steps of the embodiment of FIG. 17B.

In the variation of the image capture and display system and method of the present invention depicted in FIG. 17B, the full RGB data set from imager 1732 is stored in the storage element 1736 without any color transformation or correction being performed. As may be seen from an examination of FIG. 17B, the color transformation and/or correction is performed on the data set after retrieval from storage at step 1738 and prior to interpolation and display or printing. Otherwise, the image capture and display system depicted in FIG. 18B may be identical to that depicted in FIG. 17A.

The image capture and display method performed by the embodiment of the present invention depicted in FIG. 17B starts with the same step 1732 of the method of FIG. 17A. Wherein the image data is captured by the imager and formed into an image data set. Next, at step 1736, the raw image data set is stored.

When it is desired to display or print the stored digital image, the data set representing the digital image is retrieved from storage at step 1738. Color correction and/or transformation is then performed on the retrieved data set at step 1734. The data set representing the color-corrected image may then be interpolated at step 1740 if desired. Finally, at step 1742, the data set is then provided to display or printer 1742 as required by the user and known to persons of ordinary skill in the art.

As may be observed from examination of FIG. 17B, the amount of data, M, in the image data set remains constant throughout the storage and retrieval process until the interpolation step 1740, where the amount of data in the data set increases from the interpolation process. In the example given in FIG. 8B, the optional interpolation step increases the amount of data by a factor of 4 from M to 4M. Persons of ordinary skill in the art will recognize that the example shown in FIG. 8B is a non-limiting example and other interpolation processes performed in accordance with this invention will result in increasing the amount of data in the image data set by factors other than 4.

Figure 18A:
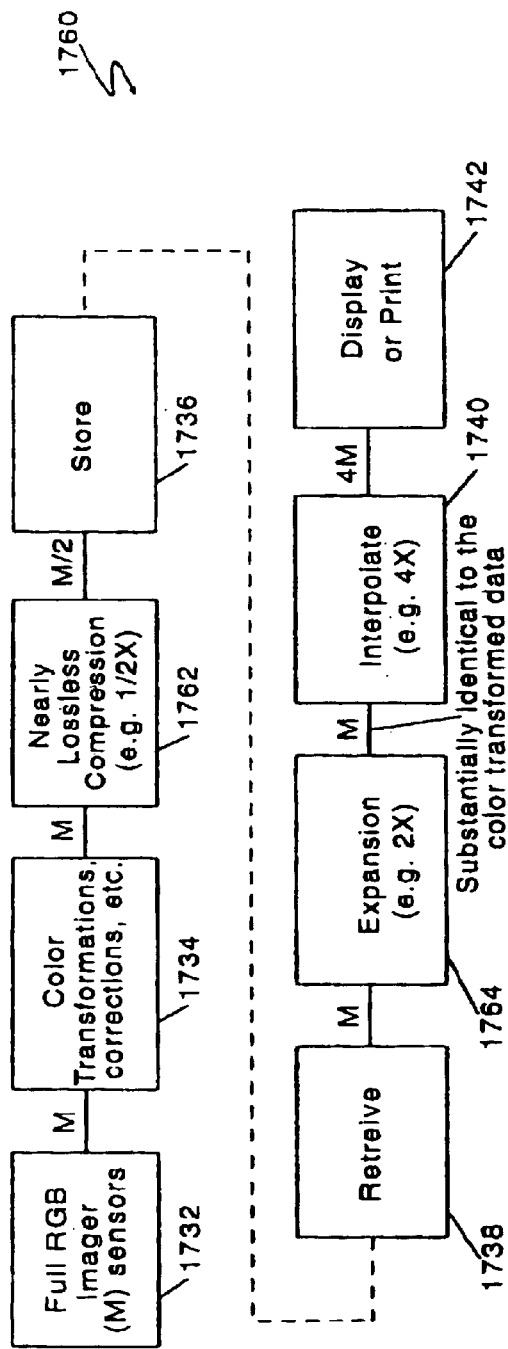
Figure 18B:
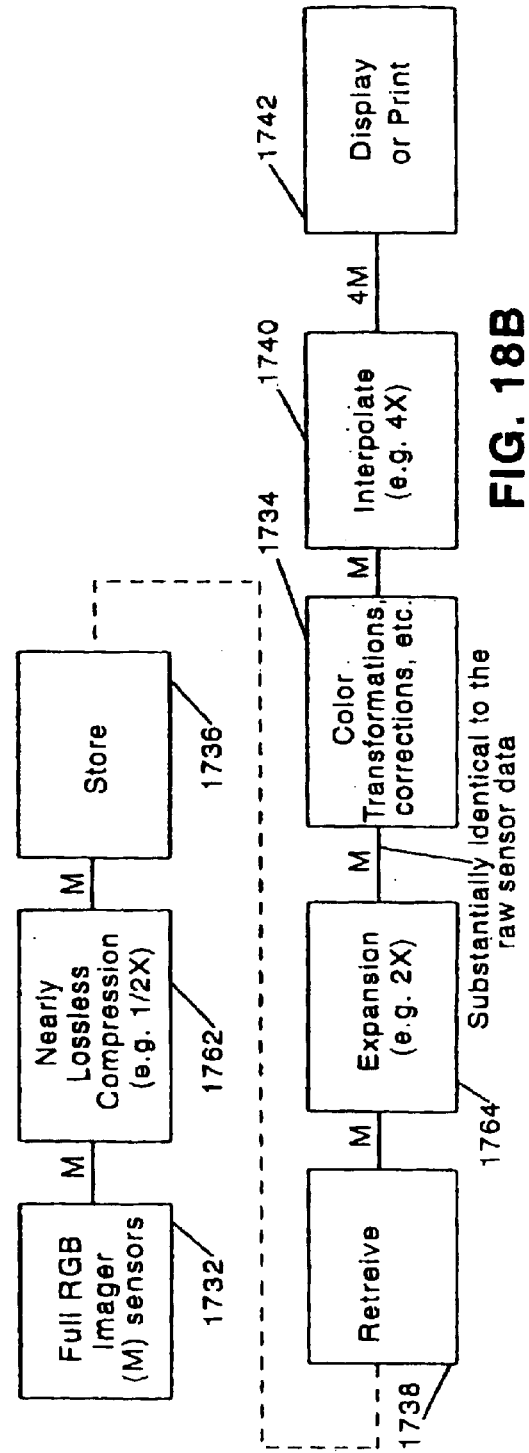

FIGS. 18A and 18B are block diagrams of alternate embodiments of an image capture and display system and method using compression according to the present invention. According to the embodiment of FIGS. 18A and 18B, the image data set may be compressed to decrease the system storage requirements. Because certain elements and process steps of the embodiment of FIGS. 18A and 18B, the same reference numerals used in FIGS. 17A and 17B will be employed to identify the corresponding elements and steps of the embodiments 18A and 18B.

Referring now to FIG. 18A, one embodiment of the second capture and display system 2260 using compression according to the present invention is shown.

Image capture and display system 2260 includes a full RGB imager 1732 as described with reference to the previously described embodiment. A full RGB output data set from the pixel sensors in imager 1732 is then processed by the color correction 1734 to perform color transformation and corrections on the image data set. Color corrector 1734 may be configured as in the prior art shown in FIG. 16 and the embodiment of the present invention illustrated in FIGS. 17A and 17B. Color correction according to this embodiment of the present invention is optional and need not be performed if deemed unnecessary.

After optional color correction has been performed on the image data set from imager 1732 of the present invention, the color-corrected image data set may then be subjected to a data compression step in data compressor 1762. The data compression step performed according to this invention in data compressor 1762 is a lossless compression, i.e., one such that the stored data can be later decompressed to produce the identical pre-compression data set, or a "nearly lossless compression step." As will be appreciated by persons of ordinary skill in the art, various means, such as a compression integrated circuit or microprocessor running compression software may be used to perform this function.

Compared to prior-art methods, the present invention as disclosed herein provides a better combination of image quality and data storage requirements in a system in which quality is a dominant concern. Prior-art methods that sense colors through a filter mosaic, then interpolate, and then compress, can achieve a comparable combination of image resolution and storage requirement, but then suffer from a potential for aliasing at the sensor; aliasing is a well known artifact of sensing through a filter mosaic, and cannot be fully corrected by subsequent processing.

Furthermore, by not interpolating before storage, the present invention allows the image processing steps such as color correction (matrixing, bad pixel replacement, and such steps) to be done after retrieval of the image data, and therefore allows for improved or modified processing steps to be used at retrieval time. Therefore, the processing and correction algorithms do not irretrievably compromise the image quality at the time of image capture and storage. Furthermore, since the full ROB image sensor delivers all three-color measurements at each pixel location, the data can be stored in a standard RGB scanned image format file without data interpolation or other expansion operations. This property of the invention allows the data to be stored and retrieved in a standard way such that subsequent processing can be done with standard color image processing tools.

In embodiments of the present invention employing compression, the same advantages can be retained while further reducing the size of the stored data set, for example by about half. As an example of using standard color image file formats, the Tagged Image File Format (TIFF) standard allows a Lempel-Ziv-Welch (LZW) lossless compressed data set that is compatible with standard TIFF file retrieval tools. Since the decompressed data set matches exactly the data set before compression, the same advantages can be retained while further reducing the size of the stored data set before compression, no loss of quality is necessary to gain this storage advantage.

Storage of data, such as image data sets, generally involves some kind of data precision compromise, such as the number of bits per color per pixel; that compromise is usually viewed as a representation issue, rather than a compression issue. For example, image sensors generally measure light intensity and represent the result using 10 to 14 bits in a linear representation of intensity; before delivering that data as an image, however, they most often convert to a nonlinear or gamma compressed representation and then round to 8-bit per color pixel. At this level of precision and this nonlinear representation, the resulting loss of quality is usually far below a perceptible level. In the present invention, the advantage of storing raw data, or color-corrected processed data, from an RGB imager, can be retained if the data set is converted to a conventional 8-bit-per-color-per-pixel representation and stored without compression or with lossless compression.

Furthermore, the same advantages can be obtained by storing the image data set using a "nearly lossless" compression technique, especially in cases in which the data set is not first converted to a representation with a small number of bits per pixel per color. For example, if the imager, or color corrector, delivers an image using 14 bits per pixel per color, then a nearly lossless compression algorithm can be used on that data set directly, as long as the retrieved and decompressed data set is sufficiently close to the original data set to keep the errors below a perceptible level.

For the purpose of the present invention, an image compression/decompression technique is defined to be "nearly lossless" if the error between the original image and the decompressed image is not more then three times the error of the usual representational step of converting to 8-bit gamma-compressed data; the errors are measured in a root-mean-square sense of typical images, in which the usual statistics of quantization give an rms error of about ⅓ of an 8-bit LSB step for the usual quantization, so allow an error equivalent to 1 LSB step for nearly lossless compression/decompression with 8-bit gamma encoded output.

Note that most lossy image compression techniques, including JPEG with a quality setting of "maximum", lead to larger errors, and so are not in the class of "nearly lossless" as defined herein. The defining threshold has been taken to be approximately the amount of noise added by a few typical image processing steps such as minor curves or level adjustment in a program such as Adobe PhotoShop, since these are not usually regarded as significantly lossy operations.

The particular type of either lossless or nearly lossless data compression used with actual embodiment fabricated according to the principles of the present invention is largely a matter of choice.

After data compression, the compressed image data set is stored in storage element 1736. Storage element 1736 may take numerous forms, such as magnetic storage (eg., floppy disks), or digital semiconductor memory storage such as flash memory or random access memory, as in the previously described embodiment of this invention.

When it is desired to display or print a stored digital image according to the system and method of the presents invention the stored data representing the color-corrected image is first retrieved from storage element 1736 by storage retrieval element 1738. As with previously described embodiments of the present invention, persons of ordinary skill in the art will appreciate that the nature of storage retrieval element 1738 depends on the nature of storage element 1736 with which it functions.

Referring back to FIG. 17A, after stored data has been retrieved from storage element 1736 in storage retrieval element 1738, the data is expanded or decompressed in data expander 1764. The nature of data expander element 1764 will depend on the nature of data compression element 1762, since these two element perform functions which are inverse of one another, or nearly so. Data expander technology is well known in the art.

After the retrieved data set is expanded, the data set may be interpolated by interpolation element 1740. Interpolation element 1740 may be the same, as in previously described embodiments herein, persons of ordinary skill in the art will recognize that the interpolation step is not necessary to the practice of this invention.

Finally, the interpolated image data set from interpolation element 1740 is then provided to display or printer 1742 as required by the user employing known hardware and software techniques for providing image data to printers or displays.

The image data storage and retrieval method of the present invention performed by the system of FIG. 18A is easily inferred from the block diagram therein. The steps of the image data storage and retrieval method performed by the image capture and display system of FIG. 18A will be inferred to using the same reference numerals identified by the elements performing these steps. Thus, first, at step 1732, an image is captured by the imager and an image data set is then processed at step 1734 to perform color transformation and/or correction if desired to produce a color-corrected image data set. Next, at step 1762, lossless or nearly lossless data compression is performed on the color-corrected image data set prior to storage. At step 1736 the compressed image data set is then stored.

When it is desired to display or print a stored digital image, the stored data representing the color-corrected image is retrieved from storage at step 1738. Next, the retrieved data is expanded at step 1764. The retrieved data representing the color-corrected image may then be interpolated at step 1740 if desired. Finally, at step 1742, the image data set is then provided to display or printer 1742 as required by the user and known to persons of ordinary skill in the art.

As may be observed from an examination of FIG. 18A, the amount of data stored is less than that stored in the embodiments of FIGS. 17A and 17B. In the embodiments described in FIGS. 17A and 17B, the amount of data, M, in the image data set remains constant throughout the storage and retrieval process until interpolation step 1740, where the amount of data may be increased by the interpolation process. In the example given in FIG. 18A, the data compression step decreases the amount of data in the image data set to M/2, but persons of ordinary skill in the art will recognize that other data compression steps producing other data compression ratios may be performed in accordance with the present invention.

As in the embodiment of FIGS. 17A and 17B the optional interpolation step the embodiment of FIG. 18A performed after expansion increases the amount of data in the data set from M to 4M. Persons of ordinary skill in the art will recognize that the example shown in FIG. 17A is a non-limiting example, and other interpolation processes performed in accordance with the principles of the present invention will result in increasing the amount of data by factors other than 4.

Referring now to FIG. 18B, a variation of the image capture and display system and method of the present invention of FIG. 18A is presented. Because the element and process steps of the embodiment of FIG. 18B are present in the embodiment of FIG. 18A, the same reference numerals used in FIG. 18A will be employed to identify the corresponding elements and steps of the embodiment of FIG. 18B.

In the variation of the image capture and display system and method of the present invention depicted in FIG. 18B, the compressed RGB data set from imager 1732 is stored in storage element 1736 without any color transformation or correction being performed. As may be seen from an examination of FIG. 18B, the color transformation and/or correction is performed after retrieval of the image data set from storage element 1738 and data expansion step 1764 and prior to interpolation and displaying or printing. Otherwise, the image capture and display system depicted in FIG. 18B may be identical to that depicted in FIG. 18A.

The image capture and display method performed by the embodiment of the present invention depicted in FIG. 18B starts with the same step 1732 of the method of FIG. 18A wherein the image data is captured by the imager and image data set is formed. Next at step 1762, data compression is performed on the image data set from imager 1732. The compressed image data is then stored at step 1736.

When it is desired to display or print a stored digital image, the stored data set representing the image is retrieved from storage at step 1738. The data set is then decompressed at step 1764. Color correction and/or transformation is then reformed on the retrieved image data set at step 1734. The color-corrected image data set may then be interpolated at step 1740 if desired. Finally, at step 1742, the image data is then provided to display or printer as required by the user and known to persons of ordinary skill in the art While embodiments and application of this invention have been shown and described, it would be apparent to those skilled in the art that many more modification than mentioned above are possible without departing from the inventive concepts herein. The invention, therefore, is not to be restricted except in the spirit of the appended claims.

What is claimed is:

1. A method for capturing and storing a full Red, Green, Blue (RGB) image data set comprising the steps of:

capturing a full RGB data set as three-color image data with an imager array, said imager array formed on a semiconductor substrate and comprising a plurality of vertical-color-filter detector groups, wherein each of said plurality of vertical-color-filter detector groups is formed on a semiconductor substrate and comprises three detector layers each configured to collect photo-generated carriers of a first polarity, separated by intervening reference layers configured to collect and conduct away photo-generated carriers of opposite polarity, said three detector layer being disposed substantially in vertical alignment with respect to one another and having different spectral sensitivities; and storing said three-color image data as digital data in a digital storage device without performing interpolation on said three-color image data.

2. The method of claim 1 wherein said step of storing comprises the step of:

storing said three-color image data as digital data in a semiconductor memory device without performing interpolation on said three-color image data.

3. The method of claim 1 wherein said step of storing comprises the step of:

storing said three-color image data as digital data in a magnetic storage device without performing interpolation on said three-color image data.

4. The method of claim 1 wherein the step of storing comprises the step of:
storing said three-color image data as digital data on an optical storage device.

5. The method of claim 1 further comprising the step of:
performing a lossless compression operation on said three-color image data prior to the step of storing said three-color image data in said digital storage device.

6. The method of claim 1 further comprising the step of:
performing a nearly lossless compression operation on said three-color image data prior to storing said three-color image data on said digital storage device.

7. A method for processing digital information from an image sensor that is formed on a semiconductor substrate and includes a plurality of vertical-color-filter detector groups, wherein each of said plurality of vertical-color-filter detector groups has three detector layers configured to collect photo-generated carriers of a first polarity, separated by intervening reference layers configured to collect and conduct away photo generated carriers of opposite polarity, said three detector layers disposed substantially in vertical alignment with one another and having different spectral sensitivities as a function of different depths of said three detector layers in said semiconductor substrate, said method comprising the steps of:
capturing three-color image data of a full RGB data set of an image using said plurality of vertical-color-filter detector groups;
storing said three color output data as digital data in a digital storage device without performing interpolation on said three color output data; and
retrieving said three color output data as digital data from said digital storage device.

8. The method of claim 7 wherein said step of storing comprises the step of:
storing said three-color image data as digital data in a semiconductor memory device without performing interpolation on said three-color image data.

9. The method of claim 1 wherein said step of storing comprises the step of:
storing said three-color image data as digital data in a magnetic storage device without performing interpolation on said three-color image data.

10. The method of claim 1 wherein the step of storing comprises the step of:
storing said three-color image data as digital data on an optical storage device.

11. The method of claim 7 further comprising the steps of:
performing a lossless compression operation on said three-color image data prior to the step of storing said three-color image data in said digital storage device; and
performing a lossless decompression operation on said three-color input data responsive to retrieving said three-color image data as digital data from said digital storage device.

12. The method of claim 7 further comprising the steps of:
performing a nearly lossless compression operation on said three-color image data prior to storing said three-color image data as said digital data in said digital storage device; and
performing a nearly lossless decompression operation on said three-color image data responsive to retrieving said three-color image data from said digital storage device.

13. A method for storing digital information from a single-chip image sensor that captures images using pixel sensor array of a plurality of vertical-color-filter detector groups wherein each of said plurality of vertical-color-filter detector groups is formed on a semiconductor substrate and has three detector layers configured to collect photo generated carriers of a first polarity, separated by intervening reference layers configured to collect and conduct away photo generated carriers of opposite polarity, said three detector layers disposed substantially in vertical alignment with one another and having different spectral sensitivities as a function of different depths of said three detector layers in said semiconductor substrate, said method comprising the steps of:
capturing three color output data of a full RGB data set of an image from said plurality of vertical-color-filter detector groups; and
storing said three color output data as digital data in a digital storage device without performing interpolation on said three color output data.

14. The method of claim 13 wherein said step of storing comprises the step of:
storing said three color output data as digital data in a semiconductor memory device without performing interpolation on said three color output data.

15. The method of claim 13 wherein said step of storing comprises the step of:
storing said three color output data as digital data in a magnetic storage device without performing interpolation on said three color output data.

16. The method of claim 13 wherein the step of storing comprises the step of:
storing said three color output data as digital data on an optical storage device.

17. The method of claim 13 further comprising the step of:
performing a lossless compression operation on said three color output data prior to the step of storing said three color digital output data in said digital storage device.

18. The method of claim 13 further comprising the step of:
performing a nearly lossless compression operation on said three color output data prior to storing said three color output data on said digital storage device.

19. A method for storing digital information from a single-chip image sensor that captures images using pixel sensor array of a plurality of vertical-color-filter detector groups wherein each of said plurality of vertical-color-filter detector groups is formed on a semiconductor substrate and has three detector layers configured to collect photo generated carriers of a first polarity, separated by intervening reference layers configured to collect and conduct away photo generated carriers of opposite polarity, said three detector layers disposed substantially in vertical alignment with one another and having different spectral sensitivities as a function of different depths of said three detector layers in said semiconductor substrate, said method comprising the steps of:
capturing three color output data of a full RGB data set of an image from said plurality of vertical-color-filter detector groups;
storing said three color output data as digital data in a digital storage device without performing interpolation on said three color output data; and
retrieving said three-color output data as digital data from said digital storage device.

20. The method of claim 19 wherein said step of storing comprises the step of:

storing said three color output data as digital data in a semiconductor memory device without performing interpolation on said three color output data.

21. The method of claim 19 wherein said step of storing comprises the step of:
storing said three color output data as digital data in a magnetic storage device without performing interpolation on said three color output data.

22. The method of claim 19 wherein the step of storing comprises the step of:
storing said three color output data as digital data on an optical storage device.

23. The method of claim 19 further comprising the steps of:
performing a lossless compression operation on said three color output data prior to the step of storing said three color output data in said digital storage device; and
performing a lossless decompression operation on said three color output data responsive to retrieving said three color digital output data as digital data from said digital storage device.

24. The method of claim 19 further comprising the steps of:
performing a nearly lossless compression operation on said three color output data prior to storing said three color output data as said digital data in said digital storage device; and
performing a nearly lossless decompression operation on said three color output data responsive to retrieving said three color output data from said digital storage device.

25. A method for processing digital information from a pixel sensor array formed on a semiconductor substrate comprising a plurality of vertical-color-filter detector groups, wherein each of said plurality of vertical-color-filter detector groups has three detector layers configured to collect photo-generated carriers of a first polarity, separated by intervening reference layers configured to collect and conduct away photo-generated carriers of opposite polarity, said three detector layers disposed substantially in vertical alignment with one another and having different spectral sensitivities as a function of different depths of said three detector layers in said semiconductor substrate, said method comprising the steps of:
receiving three-color image data of a full RGB data set of an image from said plurality of vertical-color-filter detector groups; and
storing said three-color image data as digital data in a digital storage device without performing interpolation on said three-color image data.

26. The method of claim 25 wherein said step of storing comprises the step of:
storing said three-color image data as digital data in a semiconductor memory device without performing interpolation on said three-color image data.

27. The method of claim 25 wherein said step of storing comprises the step of:
storing said three-color image data as digital data in a magnetic storage device without performing interpolation on said three-color image data.

28. The method of claim 25 wherein the step of storing comprises the step of:
storing said three-color image data as digital data on an optical storage device.

29. The method of claim 25 further comprising the step of:
performing a lossless compression operation on said three-color image data prior to the step of storing said three-color image data in said digital storage device.

30. The method of claim 25 further comprising the step of:
performing a nearly lossless compression operation on said three-color image data prior to storing said three color image data on said digital storage device.

31. A method for processing digital information from a pixel sensor array formed on a semiconductor substrate comprising a plurality of vertical-color-filter detector groups, wherein each of said plurality of vertical-color-filter detector groups has three detector layers configured to collect photo generated carriers of a first polarity, separated by intervening reference layers configured to collect and conduct away photo-generated carriers of opposite polarity, said three detector layers disposed substantially in vertical alignment with one another and having different spectral sensitivities as a function of different depths of said three detector layers in said semiconductor substrate, said method comprising the steps of:
receiving three-color image data of a full RGB data set of an image from said plurality of vertical-color-filter detector groups;
storing said three-color image data as digital data in a digital storage device without performing interpolation on said three-color image data; and
retrieving said three-color image data as digital data from said digital storage device.

32. The method of claim 31 wherein said step of storing comprises the step of:
storing said three-color image data as digital data in a semiconductor memory device without performing interpolation on said three-color image data.

33. The method of claim 31 wherein said step of storing comprises the step of:
storing said three-color image data as digital data in a magnetic storage device without performing interpolation on said three-color image data.

34. The method of claim 31 wherein the step of storing comprises the step of:
storing said three-color image data as digital data on an optical storage device.

35. The method of claim 31 further comprising the steps of:
performing a lossless compression operation on said three-color image data prior to the step of storing said three-color image data in said digital storage device; and
performing a lossless decompression operation on said three-color image data responsive to retrieving said three-color image data as digital data from said digital storage device.

36. The method of claim 31 further comprising the steps of:
performing a nearly lossless compression operation on said three-color image data prior to storing said three-color image data as said digital data in said digital storage device; and
performing a nearly lossless decompression operation on said three-color output data responsive to retrieving said three-color image data from said digital storage device.

* * * * *